(12) United States Patent
Baek et al.

(10) Patent No.: US 12,046,616 B2
(45) Date of Patent: Jul. 23, 2024

(54) IMAGE SENSOR HAVING DIFFERENT CONCENTRATION OF IMPURITIES IN THE CHANNEL REGIONS AND ISOLATION ELEMENTS

(71) Applicant: Samsung Electronics Co., Ltd., Suwon-si (KR)

(72) Inventors: Seung Ki Baek, Suwon-si (KR); Kyung Ho Lee, Suwon-si (KR); Tae Sub Jung, Hwaseong-si (KR); Doo Sik Seol, Seoul (KR); Seung Ki Jung, Bucheon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 317 days.

(21) Appl. No.: 17/318,231

(22) Filed: May 12, 2021

(65) Prior Publication Data
US 2022/0013552 A1   Jan. 13, 2022

(30) Foreign Application Priority Data
Jul. 10, 2020 (KR) .................. 10-2020-0085255

(51) Int. Cl.
*H01L 27/146* (2006.01)
(52) U.S. Cl.
CPC .... *H01L 27/1463* (2013.01); *H01L 27/14614* (2013.01); *H01L 27/14627* (2013.01); *H01L 27/14636* (2013.01)
(58) Field of Classification Search
CPC ........... H01L 27/1463; H01L 27/14614; H01L 27/14627; H01L 27/14636

USPC ......................................................... 257/292
See application file for complete search history.

(56) References Cited

U.S. PATENT DOCUMENTS

| 8,785,834 | B2 * | 7/2014 | Sakano | ............... H04N 25/771 |
| | | | | 257/292 |
| 9,018,688 | B2 | 4/2015 | Yamaguchi | |
| 9,324,753 | B2 | 4/2016 | Kato et al. | |
| 9,502,459 | B2 | 11/2016 | Miyanami | |
| 9,831,279 | B2 * | 11/2017 | Jin | ................... H01L 27/14614 |
| 10,560,652 | B2 | 2/2020 | Sano | |

(Continued)

FOREIGN PATENT DOCUMENTS

KR   2014-0093029 A   7/2014

*Primary Examiner* — Eric W Jones
(74) *Attorney, Agent, or Firm* — HARNESS, DICKEY & PIERCE, P.L.C.

(57) ABSTRACT

An image sensor includes a substrate, a first isolation region defining a unit pixel, a first photoelectric conversion region in the unit pixel, a second photoelectric conversion region in the unit pixel, the second photoelectric conversion region spaced apart from the first photoelectric conversion region, a floating diffusion region, the floating diffusion region adjacent to the first surface of the substrate, a first transfer gate on the first surface of the substrate, the first transfer gate between the first photoelectric conversion region and the floating diffusion region, and a second transfer gate on the first surface of the substrate, the second transfer gate between the second photoelectric conversion region and the floating diffusion region. At least a part of the first transfer gate is buried in the substrate, and a bottom surface of the first transfer gate is different in height from a bottom surface of the second transfer gate.

18 Claims, 27 Drawing Sheets

(56) References Cited

U.S. PATENT DOCUMENTS

| 10,784,301 B2* | 9/2020 | Hong | H01L 27/14689 |
| 2019/0267429 A1* | 8/2019 | Zhang | H01L 27/14636 |
| 2020/0027914 A1* | 1/2020 | Lee | H01L 27/14603 |

* cited by examiner

IMAGE SENSOR HAVING DIFFERENT CONCENTRATION OF IMPURITIES IN THE CHANNEL REGIONS AND ISOLATION ELEMENTS

CROSS-REFERENCE TO RELATED APPLICATION

This application claims priority from Korean Patent Application No. 10-2020-0085255 filed on Jul. 10, 2020, in the Korean Intellectual Property Office, and all the benefits accruing therefrom under 35 U.S.C. 119, the entire contents of which are herein incorporated by reference.

BACKGROUND

Some example embodiments relate to an image sensor, and more particularly, to a complementary metal oxide semiconductor (CMOS) image sensor.

An image sensor, as one of semiconductor devices, converts optical information into electric signals. Examples of image sensors may include a charge coupled device (CCD) image sensor and/or a complementary metal oxide semiconductor (CMOS) image sensor.

The image sensor may be configured in the form of a package and, in this case, the package may have a structure allowing light to be incident on a photo-receiving surface and/or sensing area, while protecting the image sensor.

SUMMARY

Some example embodiments provide an image sensor that is capable of facilitating scaling, improving a full well capacity (FWC), and/or mitigating a blooming phenomenon.

However, example embodiments are not restricted to the one set forth herein. The above and other example embodiments will become more apparent to one of ordinary skill in the art to which the present disclosure pertains by referencing the detailed description of the present disclosure given below.

According to some example embodiments, there is provided an image sensor comprising a substrate including a first surface and a second surface opposite to the first surface, a first element isolation region in the substrate, the first element isolation region defining a unit pixel, a first photoelectric conversion region in the unit pixel, a second photoelectric conversion region in the unit pixel, the second photoelectric conversion region spaced apart from the first photoelectric conversion region, a floating diffusion region in the substrate, the floating diffusion region adjacent to the first surface of the substrate, a first transfer gate on the first surface of the substrate, the first transfer gate between the first photoelectric conversion region and the floating diffusion region, and a second transfer gate on the first surface of the substrate, the second transfer gate between the second photoelectric conversion region and the floating diffusion region. At least a part of the first transfer gate is buried in the substrate, and a bottom surface of the first transfer gate is at a different level from a bottom surface of the second transfer gate.

According to some example embodiments, there is provided an image sensor comprising a first element isolation region in a substrate, the first element isolation region defining a unit pixel and having a first conductivity type, a first photoelectric conversion region in the unit pixel, the first photoelectric conversion region having a second conductivity type different from the first conductivity type, a second photoelectric conversion region in the unit pixel, the second photoelectric conversion region having the second conductivity type, a second element isolation region having the first conductivity type, the second element isolation region in the substrate, the second element isolation region between the first photoelectric conversion region and the second photoelectric conversion region, a third element isolation region having the first conductivity type, the third element isolation region in the substrate, the third element isolation region between the first element isolation region and the second element isolation region, a floating diffusion region in the substrate, the floating diffusion region having the second conductivity type, a first channel region in the substrate between the first photoelectric conversion region and the floating diffusion region, the first channel region having the first conductivity type with a first impurity concentration, a second channel region in the substrate between the second photoelectric conversion region and the floating diffusion region, the second channel region having the first conductivity type with a second impurity concentration lower than the first impurity concentration, a first transfer gate on the first channel region, at least a part of the first transfer gate buried in the substrate, and a second transfer gate on the second channel region. A third impurity concentration of the third element isolation region is less than the first impurity concentration and less than the second impurity concentration.

According to some example embodiments, there is provided an image sensor comprising a first element isolation region in a substrate, the first element isolation region defining a unit pixel and having a first conductivity type, a first photoelectric conversion circuitry in the unit pixel, a second photoelectric conversion circuitry in the unit pixel, a second element isolation region in the substrate between the first photoelectric conversion circuitry and the second photoelectric conversion circuitry, the second element isolation region having the first conductivity type, a third element isolation region in the substrate between the first element isolation region and the second element isolation region, the third element isolation region having the first conductivity type with an impurity concentration lower than those of both the first and the second element isolation regions, a first transfer gate adjacent to the first photoelectric conversion circuitry, the first transfer gate forming a first channel region in the substrate, and a second transfer gate adjacent to the second photoelectric conversion circuitry, the second transfer gate forming a second channel region in the substrate. In response to the first transfer gate being in an off state, a potential of the first channel region is at a first off potential, in response to the second transfer gate being in an off state, a potential of the second channel region is at a second off potential different from the first off potential, and a potential of the third element isolation region is less than the first off potential and less than the second off potential.

BRIEF DESCRIPTION OF THE DRAWINGS

The above and other aspects and features of example embodiments will become more apparent by describing in detail example embodiments thereof with reference to the attached drawings, in which.

DETAILED DESCRIPTION OF EXAMPLE EMBODIMENTS

Hereinafter, an image sensor according to some example embodiments will be described with reference to FIGS. 1 to 7.

Figure 1:
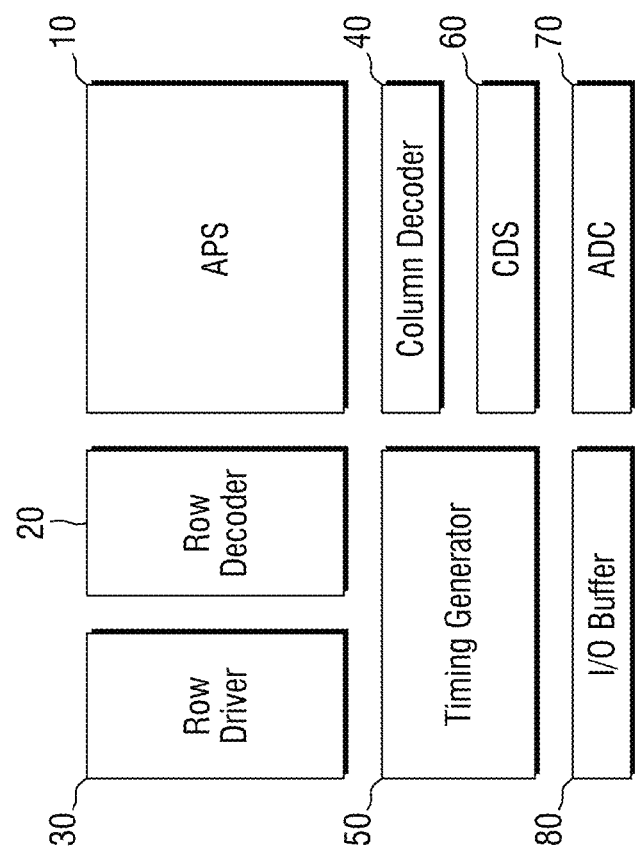
FIG. 1 is an example block diagram illustrating an image sensor according to some example embodiments.
Figure 2:
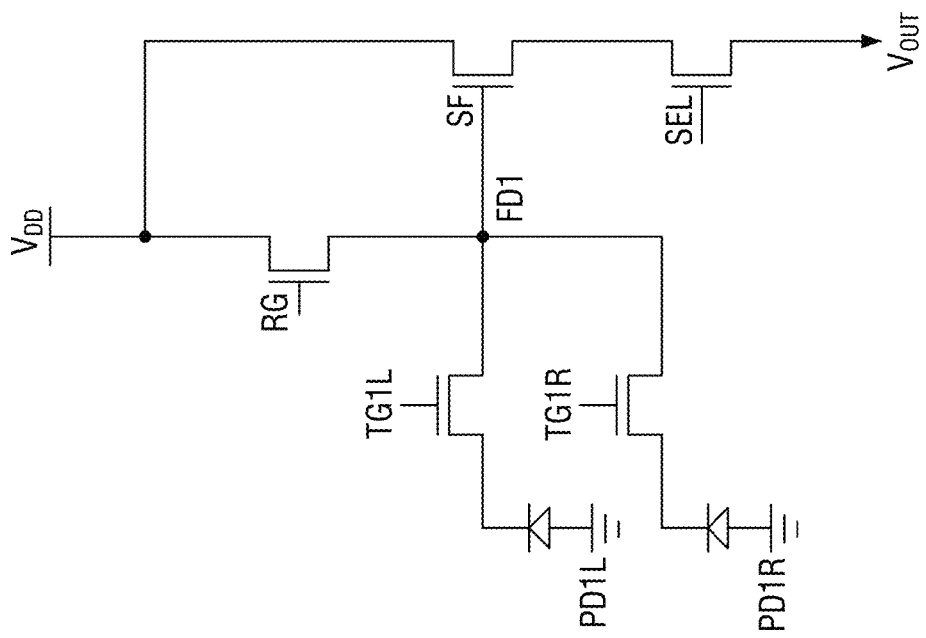
FIG. 2 is an example circuit diagram explaining a unit pixel of an image sensor according to some example embodiments.

FIG. 1 is an example block diagram illustrating an image sensor according to some example embodiments. FIG. 2 is an example circuit diagram explaining a unit pixel of an image sensor according to some example embodiments.

Referring to FIG. 1, the image sensor according to some example embodiments may include an active pixel sensor array (APS) 10, a row decoder 20, a row driver 30, a column decoder 40, a timing generator 50, a correlated double sampler (CDS) 60, an analog-to-digital converter (ADC) 70, and an input/output (I/O) buffer 80.

The APS 10 may include a plurality of individual pixels, e.g. unit pixels arranged two-dimensionally, and may convert an optical signal into an electrical signal. The APS 10 may be driven by driving signals such as a pixel selection signal, a reset signal, and a charge transfer signal received from the row driver 30. Further, the electrical signal converted by the APS 10 may be provided to the CDS 60.

The row driver 30 may provide the APS 10 with a plurality of driving signals to drive a plurality of unit pixels, according to the decoding result of the row decoder 20. When the unit pixels are arranged in a matrix such as a rectangular matrix or hexagonal matrix, driving signals may be provided for each row.

The timing generator 50 may provide a timing signal and a control signal to the row decoder 20 and the column decoder 40.

The CDS 60 may receive the electrical signal generated by the APS 10, and may hold and sample the received signal. The CDS 60 may double-sample a certain noise level and a signal level according to the electrical signal, and may output a difference level equal to or corresponding to a difference between the noise level and the signal level.

The ADC 70 may convert an analog signal corresponding to the difference level outputted from the CDS 60 into a digital signal, and may output the digital signal.

The I/O buffer 80 may latch digital signals, and the latched signals may be sequentially outputted as the digital signals to an image signal processor (not shown) according to the decoding result of the column decoder 40.

Each of, or at least some of, the components illustrated in FIG. 1 may be connected to each other. For example, each of, or at least some of the components illustrated in FIG. 1 may be connected to each other over a bus, and/or traces on a printed circuit board, and may communicate with each other over the bus and/or traces.

Referring now to FIG. 2, each unit pixel may include a first photoelectric conversion unit PD1L, a second photoelectric conversion unit PD1R, a first transfer gate TG1L, a second transfer gate TG1R, a first floating diffusion region FD1, a reset gate RG, a source follower gate SF, and a selection gate SEL.

The first and second photoelectric conversion units (also referred to as photoelectric conversion circuitries) PD1L and PD1R may each generate electric charges in proportion to an amount of light incident from the outside. The first photoelectric conversion unit PD1L may be coupled to the first transfer gate TG1L. The second photoelectric conversion unit PD1R may be coupled to the second transfer gate TG1R. The first and second photoelectric conversion units PD1L and PD1R may be or include a diode such as a photodiode and/or a pinned photodiode; however, example embodiments are not limited thereto.

The first floating diffusion region FD1 is or includes a region for converting electric charges to voltages, and has a parasitic capacitance such that electric charges may be accumulated and stored. The first transfer gate TG1L is driven by, e.g. turned on by, a first transfer line that applies a specific (or, alternatively, predetermined) bias such that electric charges generated by the first photoelectric conversion unit PD1L may be transferred to the first floating diffusion region FD1. The second transfer gate TG1R is driven by, e.g. turned on by, a second transfer line that applies a specific (or, alternatively, predetermined) bias such that the electric charges generated by the second photoelectric conversion unit PD1R may be transferred to the first floating diffusion region FD1. The biases may be greater than or equal to a voltage, e.g. a threshold voltage, of the respective first transfer gate TG1L and the second transfer gate TG1R.

In some example embodiments, the first and second transfer gates TG1L and TG1R may share the first floating diffusion region FD1. For example, one end of the first transfer gate TG1L may be connected (e.g. directly connected) to the first photoelectric conversion unit PD1L, and the other end of the first transfer gate TG1L may be connected (e.g. directly connected) to the first floating diffusion region FD1. One end of the second transfer gate TG1R may be connected (e.g. directly connected) to the second photoelectric conversion unit PD1R, and the other end of the second transfer gate TG1R may be connected (e.g. directly connected) to the first floating diffusion region FD1.

The source follower gate SF may amplify a change in the electrical potential of the first floating diffusion region FD1 receiving electric charges from the first and second photoelectric conversion units PD1L and PD1R, and may output the amplification result as an output voltage VOUT. If the source follower gate SF is turned on, a specific (or, alternatively, predetermined) electrical potential, e.g., power voltage VDD, provided to the drain of the source follower gate SF may be transferred to the drain region of the selection gate SEL.

The selection gate SEL may select a unit pixel to be read, e.g. may select a specific unit pixel to be read per row. The selection gate SEL may be driven by, e.g. turned on by, a selection line applying a specific (or, alternatively, predetermined) bias. The bias may be greater than or equal to a voltage, e.g. a threshold voltage, of the selection gate SEL.

The reset gate RG may periodically reset the first floating diffusion region FD1. The reset gate RG may be driven by, e.g. turned on by, a reset line applying a specific (or, alternatively, predetermined) bias. The bias may be greater than or equal to a voltage, e.g., a threshold voltage, of the reset gate RG. If the reset gate RG is turned on, a specific (or, alternatively, predetermined) electrical potential, e.g., power voltage VDD, provided to the drain of the reset gate RG may be transferred to the first floating diffusion region FD1.

Although each of the first and second transfer gates TG1L, TG1R, the selection gate SEL, the source follower gate SF, and the reset gate RG are illustrated as N-type transistors (e.g. NMOS transistors), example embodiments are not limited thereto. Furthermore, dimensions, such as gate lengths and/or gate widths, along with electrical characteristics, such as threshold voltages, of each of the first and second transfer gates TG1L, TG1R, the selection gate SEL, the source follower gate SF, and the reset gate RG may be the same as, or may be different from, one another.

Figure 3:
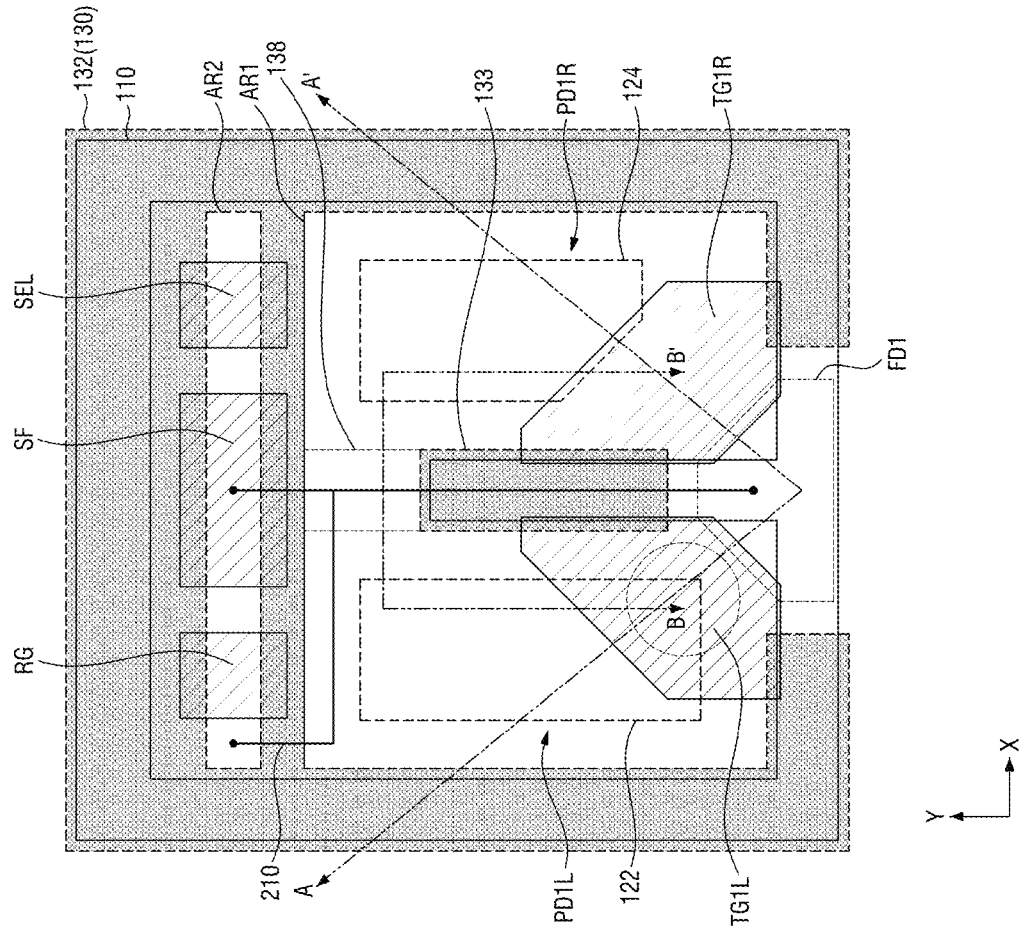
FIG. 3 is a layout diagram illustrating a unit pixel of an image sensor according to some example embodiments.
Figure 4:
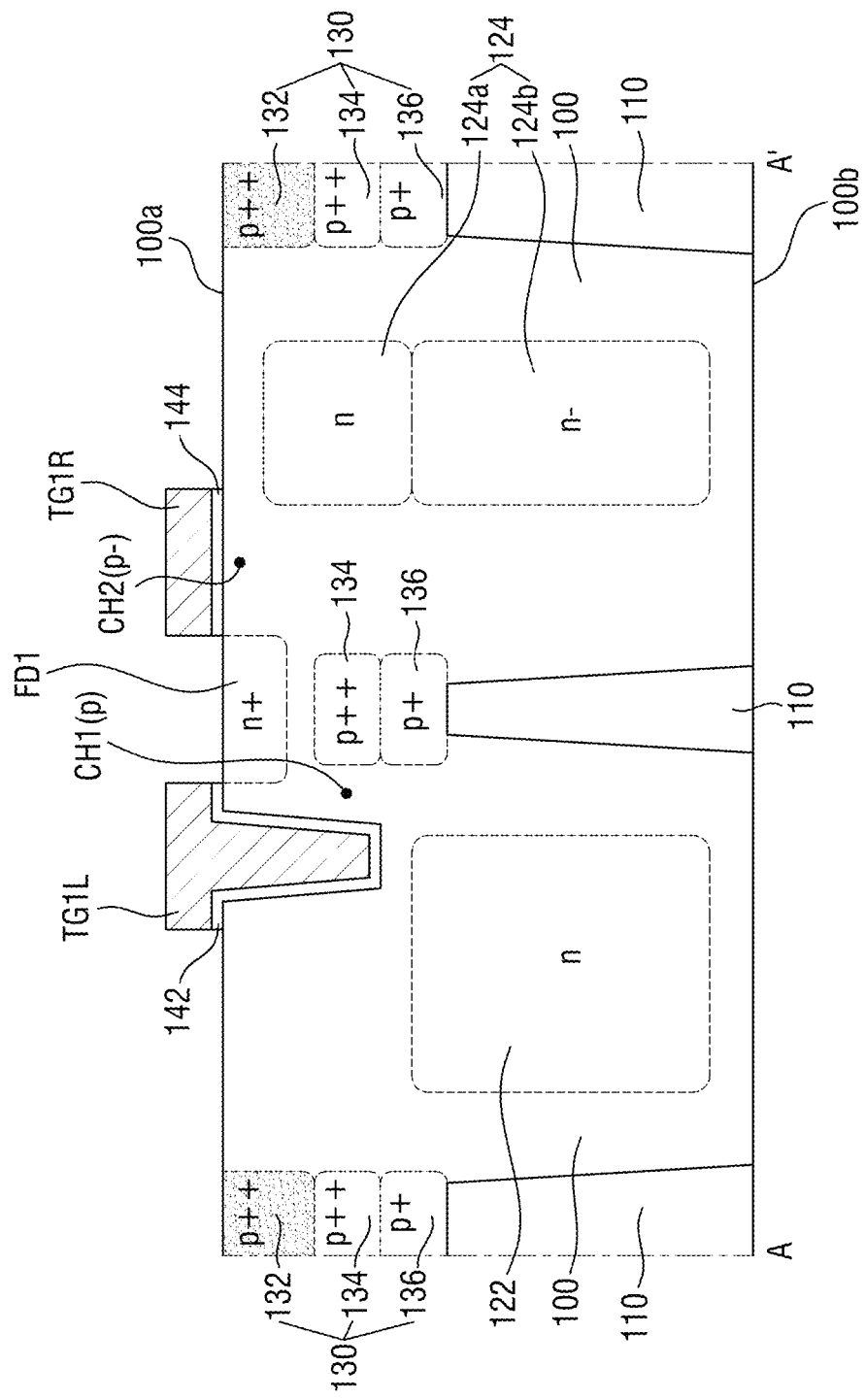
FIG. 4 is a cross-sectional view taken along line A-A' of FIG. 3.
Figure 5:
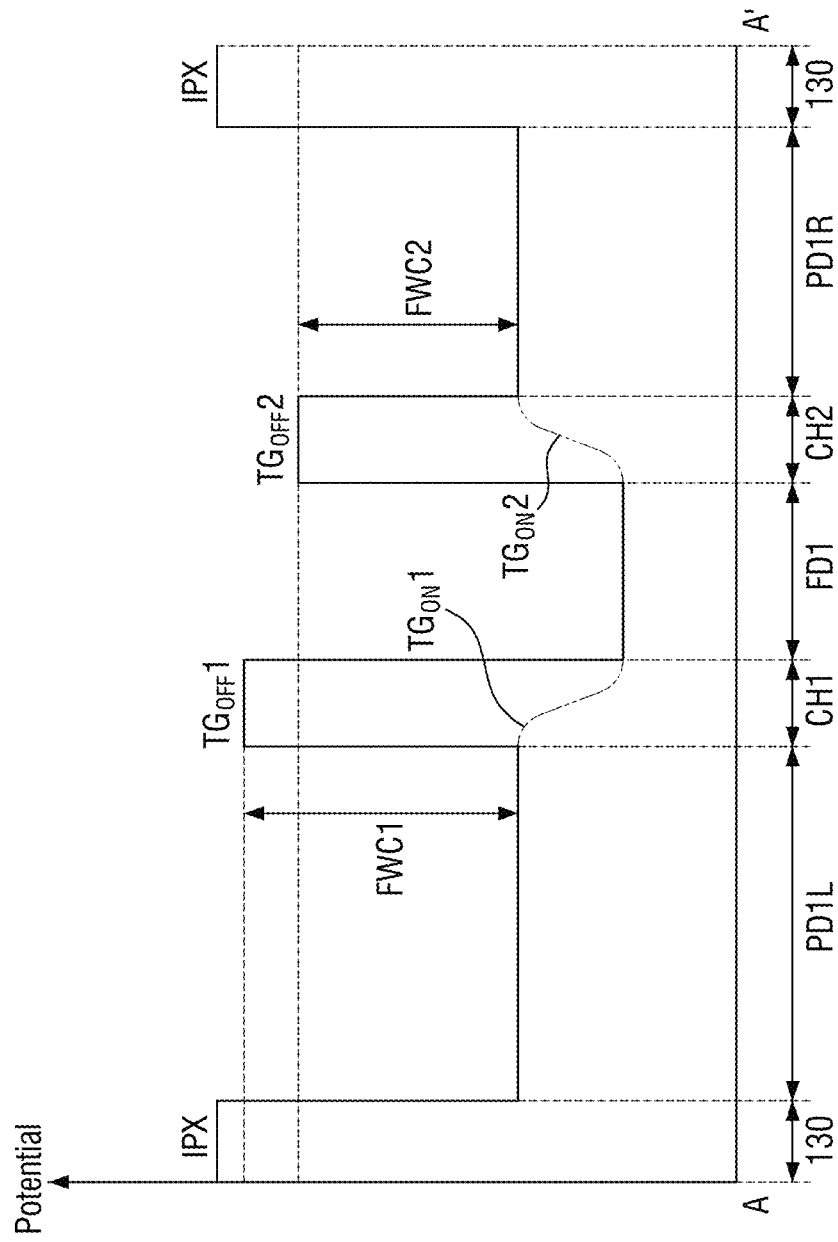
FIG. 5 is a graph explaining the potential of the image sensor of FIG. 4.
Figure 6:
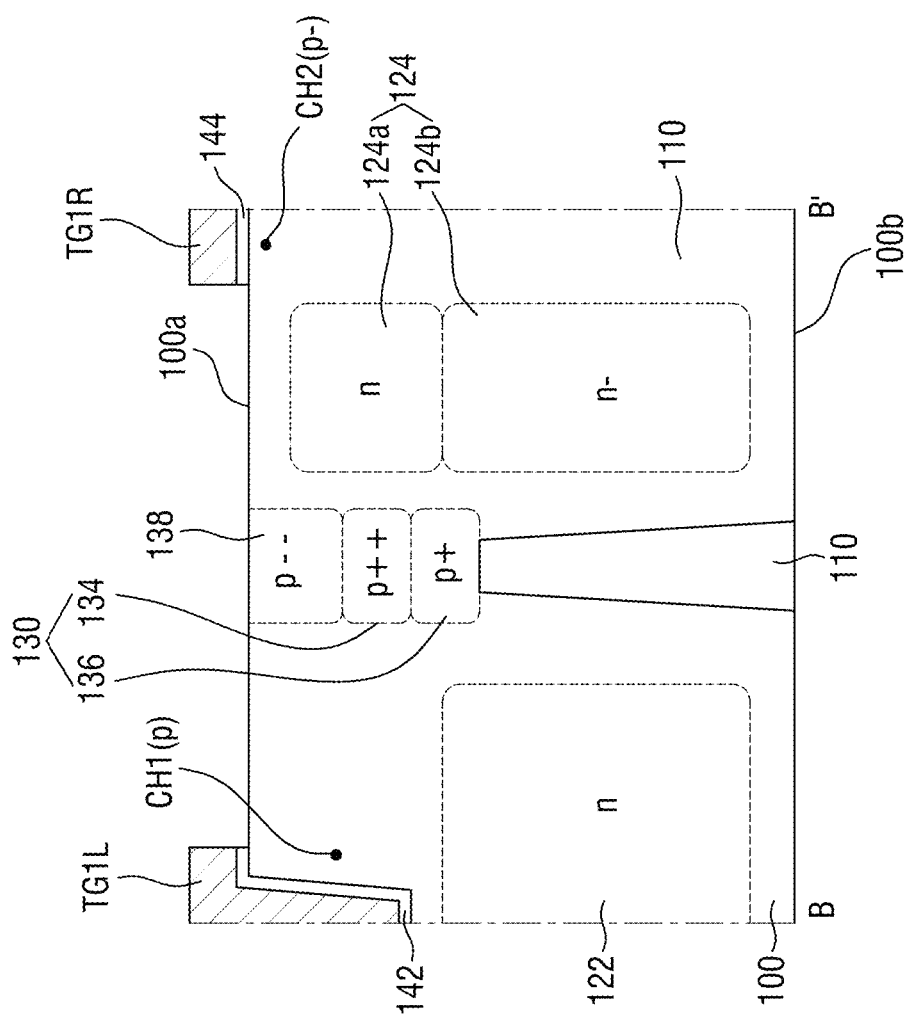
FIG. 6 is a cross-sectional view taken along line B-B' of FIG. 3.
Figure 7:
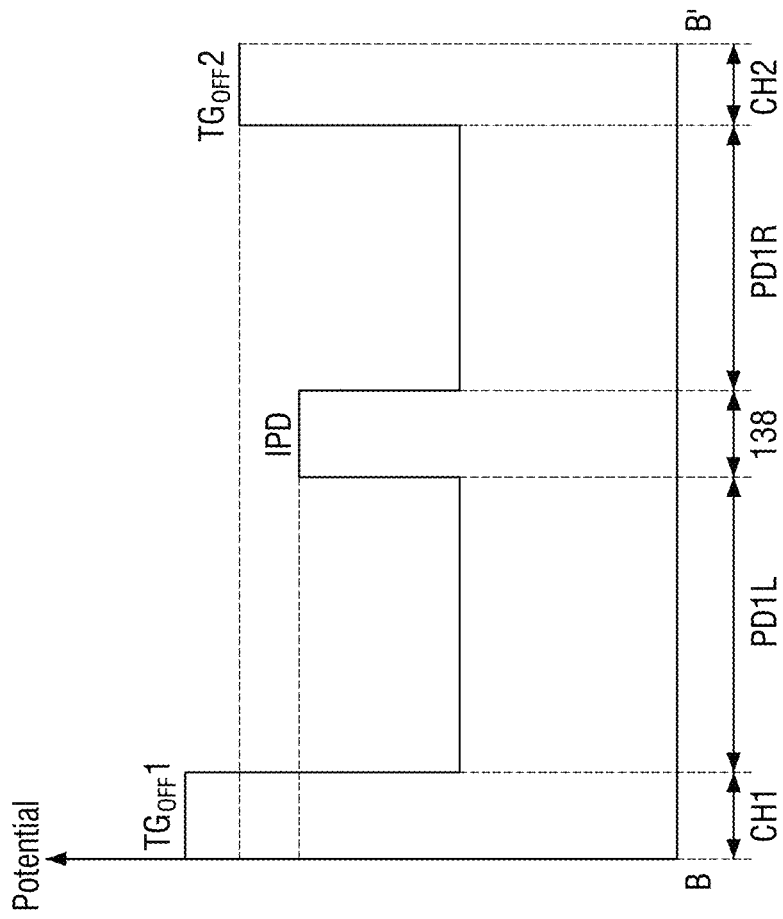
FIG. 7 is a graph explaining the potential of the image sensor of FIG. 6.

FIG. 3 is a layout diagram, e.g. a physical layout, illustrating a unit pixel of an image sensor according to some example embodiments. FIG. 4 is a cross-sectional view taken along line A-A' of FIG. 3. FIG. 5 is a graph explaining the potential of the image sensor of FIG. 4. FIG. 6 is a cross-sectional view taken along line B-B' of FIG. 3. FIG. 7 is a graph explaining the potential of the image sensor of FIG. 6. For simplicity of description, a description overlapping with the description with reference to FIGS. 1 to 2 will be briefly given or omitted.

Referring to FIGS. 1 to 7, the image sensor according to some example embodiments includes a substrate 100, a first element isolation region 130, an element isolation pattern 110, a first photoelectric conversion unit PD1L, a second photoelectric conversion unit PD1R, a second element isolation region 133, a third element isolation region 138, a first floating diffusion region FD1, a first transfer gate TG1L, and a second transfer gate TG1R.

The substrate 100 may be or include a semiconductor substrate. For example, the substrate 100 may be a bulk silicon or silicon-on-insulator (SOI) substrate. The substrate 100 may be or include a silicon substrate, and/or may include other materials such as silicon germanium, indium antimonide, lead tellurium compound, indium arsenide, indium phosphide, gallium arsenide, or gallium antimonide.

Alternatively or additionally, the substrate 100 may have an epitaxial layer formed on a base substrate, such as homogenous epitaxial silicon formed on base silicon. The substrate 100 may be undoped or be doped, e.g. be lightly doped with P-type impurities.

The substrate 100 may include a first surface 100a and a second surface 100b opposite to each other. In example embodiments to be described later, the first surface 100a may be referred to as a front side of the substrate 100, and the second surface 100b may be referred to as a back side of the substrate 100. In some example embodiments, the second surface 100b of the substrate 100 may be/correspond to a photo-receiving surface on which light is incident. For example, the image sensor according to some example embodiments may be a back side illuminated (BSI) image sensor.

In some example embodiments, the substrate 100 may have a first conductivity type. Although the description is directed to the case where the first conductivity type is a p-type, e.g. be lightly doped with p-type impurities, in the following example embodiments, this is for example only and the first conductivity type may be an n-type, e.g. be lightly doped with n-type impurities. In some example embodiments, the substrate 100 may have the first conductivity type formed by inclusion of dopants during the formation of the substrate 100, for example, formed by inclusion of boron during Czochralski growth of the substrate 100.

A plurality of unit pixels may be formed on the substrate 100. The plurality of unit pixels may be arranged two-dimensionally (e.g., in a matrix form such as a rectangular matrix or hexagonal matrix form) in a plane including, for example, a first direction X and a second direction Y. FIG. 3 shows, for example, only one unit pixel for convenience of explanation.

The first element isolation region 130 may be formed in the substrate 100 and may be adjacent to the first surface 100a of the substrate 100. The first element isolation region 130 may define a unit pixel in the substrate 100. For example, the first element isolation region 130 may be formed to surround the first and second photoelectric conversion units PD1L and PD1R to be described later. The first element isolation region 130 may have the first conductivity type, e.g. may have the same conductivity type as a conductivity type of the substrate 100. For example, the first element isolation region 130 may be formed by ion implantation/plasma assisted doping of p-type impurities (e.g., boron (B)) into the substrate 100. The first element isolation region 130 may have an impurity concentration greater than that of the substrate 100, e.g. greater than by one or more orders of magnitude.

In some example embodiments, the first element isolation region 130 may include a first impurity region 132, a second impurity region 134, and a third impurity region 136 sequentially formed from the first surface 100a of the substrate 100.

The first impurity region 132 may be adjacent to the first surface 100a of the substrate 100. The first impurity region 132 may define a first active region AR1 and a second active region AR2 in a unit pixel. The first impurity region 132 may have the first conductivity type with an impurity concentration higher than that of the substrate 100. For example, the first impurity region 132 may be doped with a high concentration of p-type impurities (p++).

The second impurity region 134 may be formed below the first impurity region 132. The second impurity region 134 may have the first conductivity type with an impurity concentration higher than that of the substrate 100. For example, the second impurity region 134 may be doped with a high concentration of p-type impurities (p++).

In some example embodiments, the second impurity region 134 may have an impurity concentration equal to that of the first impurity region 132. The term "same" as used herein not only means being completely identical but also includes a minute difference that may occur due to a process margin and/or the like.

The third impurity region 136 may be formed below the second impurity region 134. The third impurity region 136 may have the first conductivity type with an impurity concentration higher than that of the substrate 100. For example, the first impurity region 136 may be doped with a high concentration of p-type impurities (p+). In some example embodiments, the third impurity region 136 may have an impurity concentration less than that of the first impurity region 132 and/or of the second impurity region 134.

The element isolation pattern 110 may be formed in the substrate 100. The element isolation pattern 110 may define a unit pixel in the substrate 100 along with the first element isolation region 130. For example, the element isolation pattern 110 may be formed to surround the first and second photoelectric conversion units PD1L and PD1R to be described later.

In some example embodiments, the element isolation pattern 110 may extend from the second surface 100b of the substrate 100. For example, the element isolation pattern 110 may be formed by removing a portion patterned on the second surface 100b of the substrate 100 and filling an insulating material in a deep trench formed by the patterning the second surface 100b of the substrate 100. In some example embodiments, the element isolation pattern 110 may not extend to the first surface 100a of the substrate 100. For example, the element isolation pattern 110 may extend from the second surface 100b of the substrate 100 to the first element isolation region 130 (e.g., third impurity region 136).

The first and second photoelectric conversion unit PD1L and PD1R may be formed in the unit pixel. The first and second photoelectric conversion units PD1L and PD1R may generate electric charges in proportion to an amount of light incident from the outside.

The first photoelectric conversion unit PD1L may include a first photoelectric conversion region 122 having a second conductivity type in the substrate 100. The second photoelectric conversion unit PD1R may include a second photoelectric conversion region 124 having the second conductivity type in the substrate 100. The second conductivity type may differ from the first conductivity type. Although the description is directed to the case where the second conductivity type is an n-type impurity in the following example embodiments, this is only example and the second conductivity type may be a p-type impurity.

The first and second photoelectric conversion regions 122 and 124 may be formed, for example, by ion implantation of n-type impurities (e.g., phosphorus (P) and/or arsenic (As)) in the p-type substrate 100.

In some example embodiments, the first photoelectric conversion region 122 and/or the second photoelectric conversion region 124 may have a potential gradient in a direction crossing the first and second surfaces 100a and 100b of the substrate 100. For example, the impurity concentration of the first photoelectric conversion region 122 and/or the second photoelectric conversion region 124 may decrease in a direction from the first surface 100a to the second surface 100b. The potential gradient may be formed during an ion implantation process and/or during a thermal annealing process; however, example embodiments are not limited thereto.

In some example embodiments, the second photoelectric conversion region 124 may include a first sub-photoelectric conversion region 124a and a second sub-photoelectric conversion region 124b. The second sub-photoelectric conversion region 124b may be formed beneath the first sub-photoelectric conversion region 124a. For example, the second sub-photoelectric conversion region 124b may be formed in a region deeper than that of the first sub-photoelectric conversion region 134a in the substrate 100. For example, the second sub-photoelectric conversion region 124b may be spaced farther apart than the first sub-photoelectric conversion region 124a from the first surface 100a of the substrate 100.

In some example embodiments, the second sub-photoelectric conversion region 124b may have the second conductivity type with an impurity concentration less than that of the first sub-photoelectric conversion region 124a. For example, the second sub-photoelectric conversion region 124b may be doped with a low concentration of n-type impurities (n−).

The second element isolation region 133 may be formed in the substrate 100 and may be adjacent to the first surface 100a of the substrate 100. The second element isolation region 133 may be interposed between the first photoelectric conversion unit PD1L and the second photoelectric conversion unit PD1R to separate the first photoelectric conversion unit PD1L from the second photoelectric conversion unit PD1R. In some example embodiments, the second element isolation region 133 may be spaced from the first element isolation region 130.

The second element isolation region 133 may have the first conductivity type with an impurity concentration greater than that of the substrate 100. For example, the second element isolation region 133 may be doped with a high concentration of p-type impurities (p++). In some example embodiments, the second element isolation region 133 may have an impurity concentration equal to that of the first impurity region 132, and may be formed at the same time as the formation of the first impurity region 132; however, example embodiments are not limited thereto.

The third element isolation region 138 may be formed in the substrate 100 and may be adjacent to the first surface 100a of the substrate 100. The third element isolation region 138 may be interposed between the first element isolation region 130 and the second element isolation region 133 to separate the first photoelectric conversion unit PD1L from the second photoelectric conversion unit PD1R. For example, the first and second photoelectric conversion units PD1L and PD1R may be arranged along the first direction X, and the second and third element isolation regions 133 and 138 may be arranged along the second direction Y.

The third element isolation region 138 may have the first conductivity type with an impurity concentration less than that of the first element isolation region 130 and/or the second element isolation region 133, e.g. less than by at least one order of magnitude. For example, the third element isolation region 138 may be doped with a low concentration of p-type impurities (p−−).

In some example embodiments, at least a part of the second impurity region 134 and at least a part of the third impurity region 136 may be formed below the third element isolation region 138. For example, as shown in FIG. 6, at least a part of the second impurity region 134 and at least a part of the third impurity region 136 may be interposed between the third element isolation region 138 and the element isolation pattern 110. A position, e.g. a height, of the first impurity region 132, the second impurity region 134, the third impurity region 136, and the element isolation region 138 may be determined by/based on an energy used in ion implantation of the respective impurity regions/ element isolation regions. The second impurity region 134 and/or the third impurity region 136 may prevent, or reduce the likelihood of, the electric charges passing through the third element isolation region 138 from being diffused toward the second surface 100b of the substrate 100, which leads to improvement of a charge transfer rate of the image sensor.

The first floating diffusion region FD1 may be formed in the substrate 100 and may be adjacent to the first surface 100a of the substrate 100. For example, the first floating diffusion region FD1 may be formed in the first active region AR1. The first floating diffusion region FD1 may have the second conductivity type, e.g. may have a conductivity type opposite that of the substrate 100. For example, the first floating diffusion region FD1 may be formed by ion implementation of n-type impurities in the p-type substrate 100.

In some example embodiments, the first floating diffusion region FD1 may have the second conductivity type with an impurity concentration greater than (e.g. greater by one or more orders of magnitude than) those of the first and second photoelectric conversion regions 122 and 124. For example, the first floating diffusion region FD1 may be doped a high concentration of n-type impurities (n+).

In some example embodiments, at least a part of the second impurity region 134 and at least a part of the third impurity region 136 may be formed below the first floating diffusion region FD1. For example, as shown in FIG. 4, at least a part of the second impurity region 134 and at least a part of the third impurity region 136 may be interposed between the first floating diffusion region FD1 and the element isolation pattern 110. The second and third impurity regions 134 and 136 may prevent or reduce the likelihood of the electric charges of the first floating diffusion region FD1 from being diffused toward the second surface 100b of the substrate 100, thereby improving the charge transfer rate of the image sensor.

The first transfer gate TG1L may be formed on the first surface 100a of the substrate 100. The first transfer gate TG1L may be adjacent to the first photoelectric conversion unit PD1L. For example, the first transfer gate TG1L may be interposed between the first photoelectric conversion region 122 and the first floating diffusion region FD1.

A first gate dielectric layer 142 may be interposed between the first transfer gate TG1L and the substrate 100. For example, the first gate dielectric layer 142 may include silicon oxide; however, example embodiments are not limited thereto.

The first transfer gate TG1L may form the first channel region CH1 in the substrate 100. For example, the first channel region CH1 may be formed in the first active region AR1. The first channel region CH1 may be formed below the first transfer gate TG1L between the first photoelectric conversion region 122 and the first floating diffusion region FD1. The first channel region CH1 may have the first conductivity type.

If the first transfer gate TG1L is turned on, e.g. if a voltage of the first transfer gate TG1L is greater than or equal to a threshold voltage of the first transfer gate TG1L, the electric charges generated from the first photoelectric conversion region 122 may be transferred to the first floating diffusion region FD1. For example, as shown in FIG. 5, if the first transfer gate TG1L is turned on, the potential of the first channel region CH1 may be lowered from a first off potential $TG_{OFF}1$ to a first on potential $TG_{ON}1$. Accordingly, the electric charges of the first photoelectric conversion region 122 may be transferred to the first floating diffusion region FD1.

In some example embodiments, the first transfer gate TG1L may be a vertical transfer gate. For example at least a part of the first transfer gate TG11 may be buried in the substrate 100. For example, a trench extending from the first surface 100a of the substrate 100 may be formed in the substrate 100. The lower part of the first transfer gate TG1L may be formed to fill the trench. Accordingly, the bottom surface of the first transfer gate TG1L may be formed lower than/less than the first surface 100a of the substrate 100.

In some example embodiments, the first photoelectric conversion region 122 may be formed below the first transfer gate TG1L. For example the first photoelectric conversion region 122 may be formed in a deep region of the substrate 100. For example, the first photoelectric conversion region 122 may be spaced farther apart than the second photoelectric conversion region 124 from the first surface 100a of the substrate 100. Accordingly, the first channel region CH1 may be formed from a deep region of the substrate 100. This may make it possible to secure a space of the first surface 100a adjacent to the first transfer gate TG1L, leading to provision of an image sensor with easy/ more easy scaling.

The second transfer gate TG1R may be formed on the first surface 100a of the substrate 100. The second transfer gate TG1R may be adjacent to the second photoelectric conversion unit PD1R. For example, the second transfer gate TG1R may be interposed between the second photoelectric conversion region 124 and the first floating diffusion region FD1.

In some example embodiments, the first and second transfer gates TG1L and TG1R may share the first floating diffusion region FD1. For example, the first transfer gate TG1L may be adjacent to one side surface of the first floating diffusion region FD1, and the second transfer gate TG1R may be adjacent to the other side surface of the first floating diffusion region FD1.

A second gate dielectric layer 144 may be interposed between the second transfer gate TG1R and the substrate 100. For example, the second gate dielectric layer 144 may include silicon oxide and/or may be formed at the same time as the first gate dielectric layer 142; however, example embodiments are not limited thereto.

The second transfer gate TG1R may form a second channel region CH2 in the substrate 100. For example, the second channel region CH2 may be formed in the first active region AR1. The second channel region CH2 may be formed below the second transfer gate TG1R between the second photoelectric conversion region 124 and the first floating diffusion region FD1. The second channel region CH2 may have the first conductivity type.

If the second transfer gate TG1R is turned on, e.g. if a voltage of the second transfer gate TG1R is greater than or equal to a threshold voltage of the second transfer gate TG1R, the electric charges generated from the second photoelectric conversion region 124 may be transferred to the first floating diffusion region FD1. For example, as shown in FIG. 5, if the second transfer gate TG1R is turned on, the potential of the second channel region CH2 may be lowered from a second off potential $TG_{OFF}2$ to a second on potential $TG_{ON}2$. Accordingly, the electric charges of the second photoelectric conversion region 124 may be transferred to the first floating diffusion region FD1.

In some example embodiments, the first off potential $TG_{OFF}1$ of the first channel region CH1 in the case where the first transfer gate TG1L is in an off state may differ from the second off potential $TG_{OFF}2$ of the second channel region CH2 in the case where the second transfer gate TG1R is in an off state. For example, as shown in FIGS. 5 and 7, the first off potential $TG_{OFF}1$ may be higher than the second off potential $TG_{OFF}2$.

In some example embodiments, the second channel region CH2 may have the first conductivity type with an impurity concentration lower than/less than that of the first channel region CH1. For example, the second channel region CH2 may be doped with a low concentration of p-type impurities (p−).

As the first off potential $TG_{OFF}1$ increases, the full well capacity (FWC), as a total amount of electric charges that the first photoelectric conversion unit PD1L can hold, may be improved. For example, a first FWC FWC1 of the first photoelectric conversion region 122 may be greater than a second FWC FWC2 of the second photoelectric conversion region 124. This may make it possible for the image sensor to have an improved FWC.

In some example embodiments, the first off potential $TG_{OFF}1$ may be close to a potential IPX of the first element isolation region 130 and/or a ground potential. This may make it possible for the image sensor to have a further improved FWC.

In some example embodiments, the first and second off potentials $TG_{OFF}1$ and $TG_{OFF}2$ may be lower than/less than the potential IPX of the first element isolation region 130. For example, as shown in FIG. 5, the first off potential $TG_{OFF}1$ may be lower than/less than the potential IPX of the first element isolation region 130, and the second off potential $TG_{OFF}2$ may be lower than/less than the first off potential $TG_{OFF}1$.

In some example embodiments, the potential IPD of the third element isolation region 138 may be lower than/less than the first off potential $TG_{OFF}1$ and the second off potential $TG_{OFF}2$. For example, as shown in FIG. 7, the second off potential $TG_{OFF}2$ may be lower than/less than the first off potential $TG_{OFF}1$, and the potential IPD of the third element isolation region 138 may be lower than/less than the second off potential $TG_{OFF}2$.

In some example embodiments, the third element isolation region 138 may have the first conductivity type with an impurity concentration lower than that of the first channel region CH1 and the second channel region CH2. For example, the third element isolation region 138 may be doped with a low concentration of p-type impurities (p−−).

In some example embodiments, the bottom surface of the first transfer gate TG1L may differ in height, e.g. height within the substrate 100, from the bottom surface of the second transfer gate TG1R. For example, as shown in FIGS. 4 and 6, the first and second transfer gates TG1L and TG1R of the substrate 100 may be formed such that the bottom surface of the first transfer gate TG1L is lower in height than the bottom surface of the second transfer gate TG1R from the second surface 100b of the substrate 100. In some example embodiments, the first transfer gate TG1L may be or correspond to a vertical transfer gate, and the second transfer gate TG1R may be or correspond to a planar transfer gate. For example, the bottom surface of the second transfer gate TG1R may extend along the first surface 100a of the substrate 100.

In some example embodiments, a reset gate RG, a source follower gate SF, and a selection gate SEL may be formed in/correspond to components of a unit pixel.

The reset gate RG, the source follower gate SF, and the selection gate SEL may be formed on the second active region AR2 spaced apart from the first active region AR1. For example, the second active region AR2 may be formed to extend in the first direction X, and the reset gate RG, the source follower gate SF, and the selection gate SEL may be sequentially arranged along the first direction X.

Although it is shown that the first and second active regions AR1 and AR2 are arranged along the second direction Y, this is only by example. For example, unlike the illustrated example, the first and second active regions AR1 and AR2 may be arranged along the second direction Y. In this case, the second active region AR2 may be formed to extend in the second direction Y, and the reset gate RG, the source follower gate SF, and the selection gate SEL may be sequentially arranged along the second direction Y.

In some example embodiments, the source follower gate SF may be electrically connected to the first floating diffusion region FD1. For example, as shown in FIG. 3, a wiring 210 connecting the source follower gate SF to the first floating diffusion region FD1 may be formed. Depending on the potential of the first floating diffusion region FD1, a specific (or alternatively predetermined) electrical potential, e.g., power voltage VDD, being applied to the drain/drain node of the source follower gate SF may be transferred to the drain region of the selection gate SEL.

In some example embodiments, the source/source node of the reset gate RG may be electrically connected to the first floating diffusion region FD1. For example, as shown in FIG. 3, the wiring 210 may connect the source of the reset gate RG to the first floating diffusion region FD1. Accordingly, a specific (or, alternatively, predetermined) electrical potential, e.g., power voltage VDD being applied to the drain of the reset gate RG may be transferred to the first floating diffusion region FD1.

Hereinafter, effects of an image sensor according to some example embodiments will be described with reference to FIGS. 1 to 9B.

Figure 8:
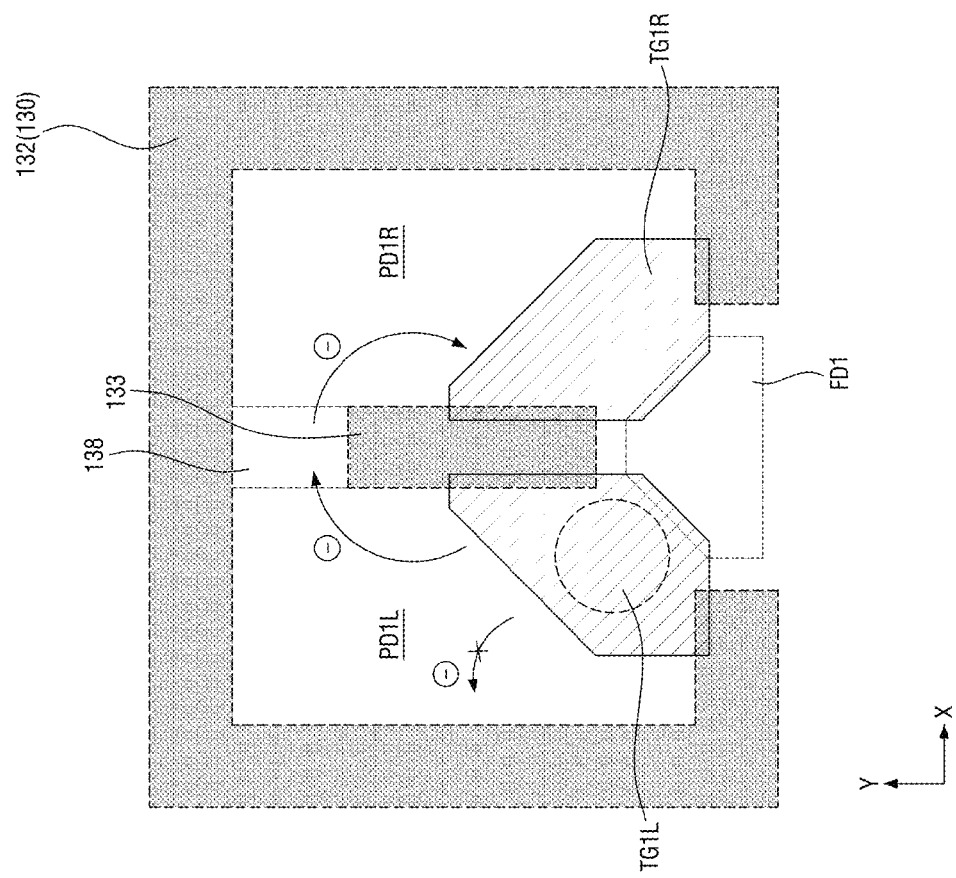
FIG. 8 is a layout diagram illustrating a blooming path of an image sensor according to some example embodiments.
Figure 9A:
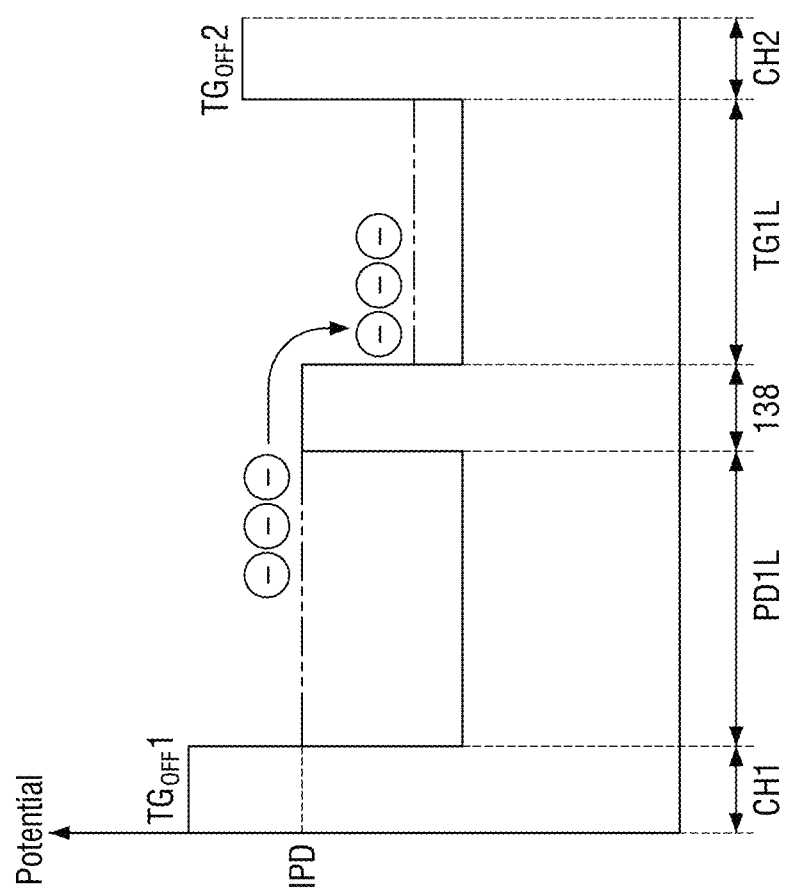
FIGS. 9A and 9B are graphs explaining a blooming path of an image sensor according to some example embodiments.
Figure 9B:
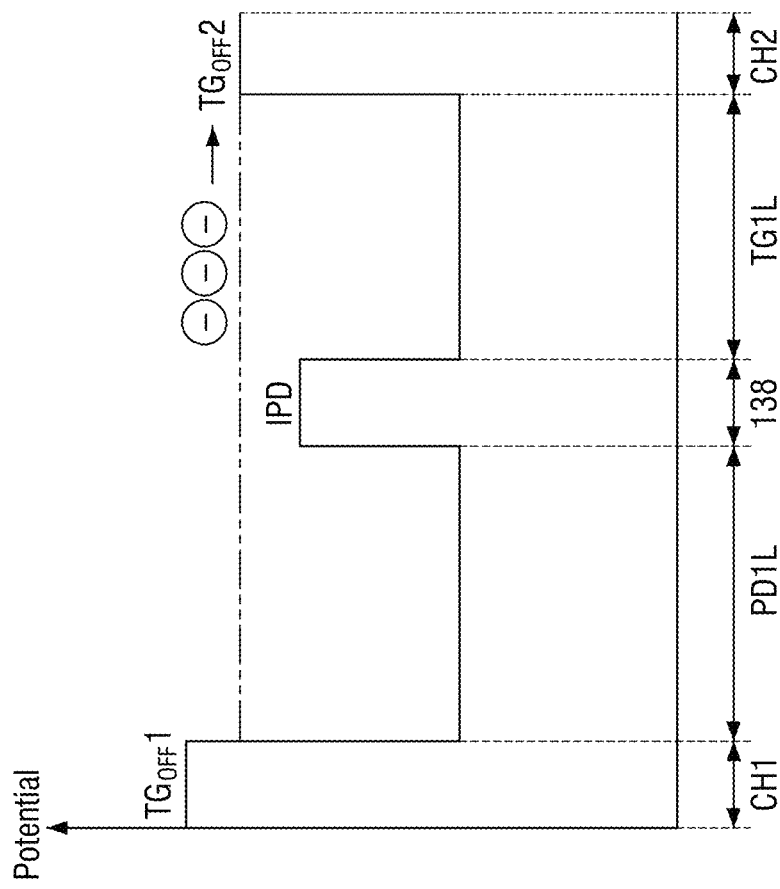

FIG. 8 is a layout diagram illustrating a blooming path of an image sensor according to some example embodiments. FIGS. 9A and 9B are graphs explaining a blooming path of an image sensor according to some example embodiments. For simplicity of description, a description overlapping with the description with reference to FIGS. 1 to 7 will be briefly given or omitted.

Referring to FIGS. 8 and 9A, in the case where light is incident on a unit pixel of the image sensor according to some example embodiments, the potential of the first photoelectric conversion unit PD1L and the potential of the second photoelectric conversion unit PD1R may increase.

Depending on the photo-receiving amount, the increased potential amount of the first photoelectric conversion unit PD1L may be greater than the increased potential amount of the second photoelectric conversion unit PD1R. If the potential of the first photoelectric conversion unit PD1L increases to reach the potential IPD of the third element isolation region 138, the electric charges of the first photoelectric conversion unit PD1L may overflow/cross the third element isolation region 138 and move to the second photoelectric conversion unit PD1R having a relatively low potential. This may, as shown in FIG. 8, make it possible to prevent/reduce the likelihood of a blooming phenomenon in which electric charges of the first photoelectric conversion unit PD1L cross the first element isolation region 130 and move to adjacent unit pixels.

In contrast to the illustrated example, depending to the photo-receiving amount, the increase amount of the potential of the second photoelectric conversion unit PD1R may be greater than the increase amount of the potential of the first photoelectric conversion unit PD1L. If the potential of the second photoelectric conversion unit PD1R increases to reach the potential IPD of the third element isolation region 138, electric charges of the second photoelectric conversion unit PD1R may cross the third element isolation region 138 and move to the first photoelectric conversion unit PD1L having a relatively low potential. This may make it possible to prevent/reduce the likelihood of a blooming phenomenon in which electric charges of the second photoelectric conversion unit PD1R cross the first element isolation region 130 and move to adjacent unit pixels.

Referring to FIGS. 8 and 9B, in the case where light is incident on a unit pixel of the image sensor according to some example embodiments, the potential of the first photoelectric conversion unit PD1L and the potential of the second photoelectric conversion unit PD1R may further increase.

Depending on the photo-receiving amount, the increased potentials of the first and second photoelectric conversion units PD1L and PD1R may be higher than/greater than the potential IPD of the third element isolation region 138. Here, because the second off potential $TG_{OFF}2$ may be lower than the first off potential $TG_{OFF}1$, the potentials of the first and second photoelectric conversion units PD1L and PD1R may reach the second off potential $TG_{OFF}2$ earlier than the first off potential $TG_{OFF}1$. Accordingly, electric charges of the first and second photoelectric conversion units PD1L and PD1R may move to the second channel region CH2.

For example, as shown in FIG. 8, a blooming path in which electric charges of the first photoelectric conversion unit PD1L cross the third element isolation region 138 and gradually move toward the second transfer gate TG1R may be formed. This may further mitigate the blooming phenomenon in which electric charges of the first photoelectric conversion unit PD1L cross the first element isolation region 130 and move to adjacent unit pixels.

As the unit pixel size of the image sensor decreases, a problem may arise in that it is difficult to secure a sufficient FWC due to a lack of space, e.g. lack of physical space, for the photoelectric conversion regions. In order to solve or mitigate this problem, it can be considered to increase the off potential of the channel region to increase the FWC, but excessively increasing the off potential of the channel region may likely cause the blooming phenomenon in which electric charges move to adjacent unit pixels.

The image sensor according to some example embodiments forms a blooming path from the first photoelectric conversion unit PD1L to the second transfer gate TG1R across the third element isolation region 138, which makes it possible to more efficiently prevent or reduce the likelihood of the blooming phenomenon in which electric charges of the first photoelectric conversion unit PD1L cross the first element isolation region 130 and move to adjacent unit pixels. For example, as described above, the second off potential $TG_{OFF}2$ may be lower than the first off potential $TG_{OFF}1$, and the potential IPD of the third element isolation region 138 may be lower than the second off potential $TG_{OFF}2$. Accordingly, electric charges of the first photoelectric conversion unit PD1L may cross the third element isolation region 138 and gradually move to the second transfer gate TG1R.

Alternatively or additionally, in the image sensor according to some example embodiments, the first photoelectric conversion unit PD1L may have a sufficient first FWC FWC1 due to the high first off potential $TG_{OFF}1$ of the first channel region CH1 (e.g., potential IPX of the first element isolation region 130 or potential close to the ground potential). This means that the image sensor according to some example embodiments is advantageous in terms of securing a high FWC and efficiently preventing or reducing the likelihood of a blooming phenomenon.

Hereinafter, various image sensors according to some example embodiments will be described with reference to FIGS. 1 to 26.

Figure 10:
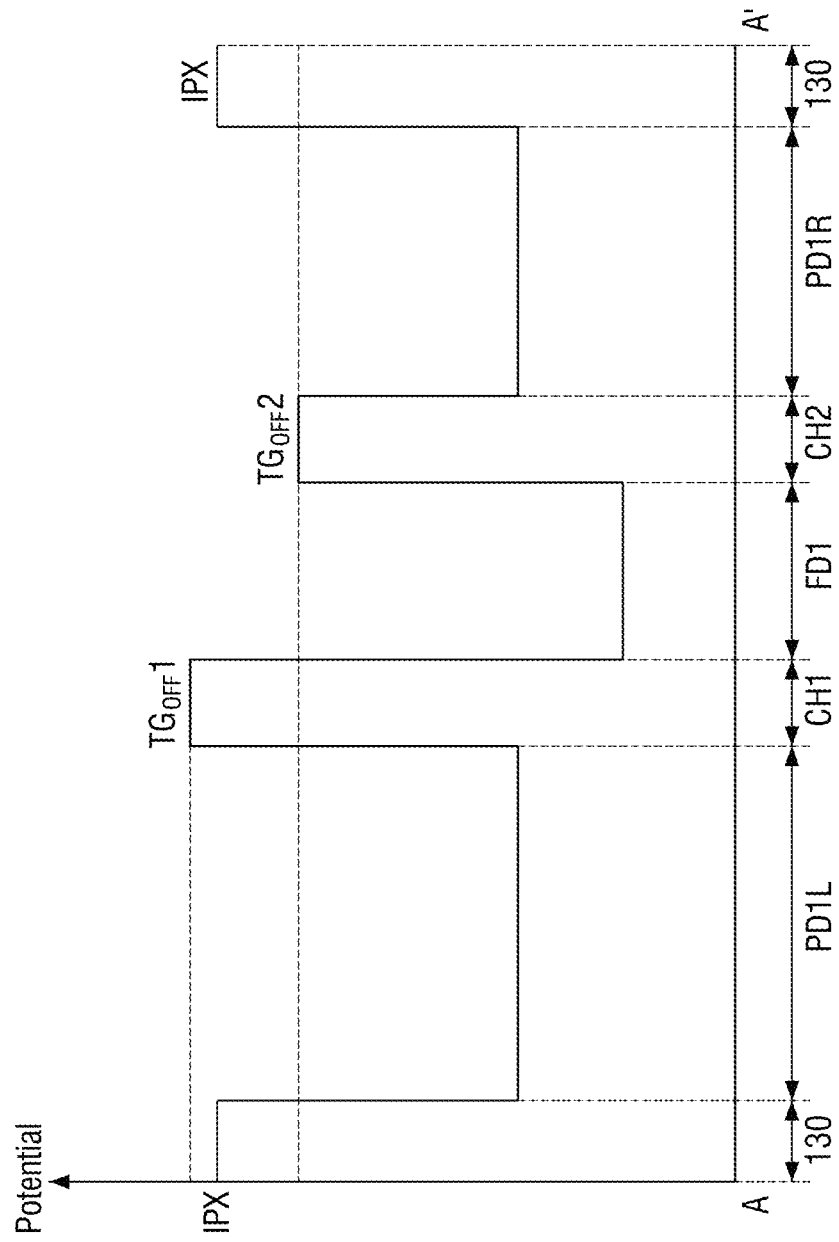
FIG. 10 is a graph explaining an image sensor according to some example embodiments.

FIG. 10 is a graph explaining an image sensor according to some example embodiments. For simplicity of description, a description overlapping with the description with reference to FIGS. 1 to 9B will be briefly given or omitted.

Referring to FIG. 10, the image sensor according to some example embodiments is characterized in that the first off potential $TG_{OFF}1$ is higher than the potential IPX of the first element isolation region 130.

For example, the potential IPX of the first element isolation region 130 may be lower than the first off potential $TG_{OFF}1$, and the second off potential $TG_{OFF}2$ may be lower than/less than the first off potential $TG_{OFF}1$. This may further improve the FWC of the image sensor.

Even though the potential IPX of the first element isolation region 130 is lower than/less than the first off potential $TG_{OFF}1$, the potential IPD of the third element isolation region 138 may be lower than/less than the potential IPX of the first element isolation region 130 (see the description made with reference to FIGS. 5, 7, 9A, and 9B. Accordingly, the blooming path for the electric charges of the first photoelectric conversion unit PD1L to gradually move toward the second transfer gate TG1R across the third element isolation region 138 may still be maintained, thereby efficiently preventing/reducing the likelihood of the blooming phenomenon of the first photoelectric conversion unit PD1L.

Figure 11:
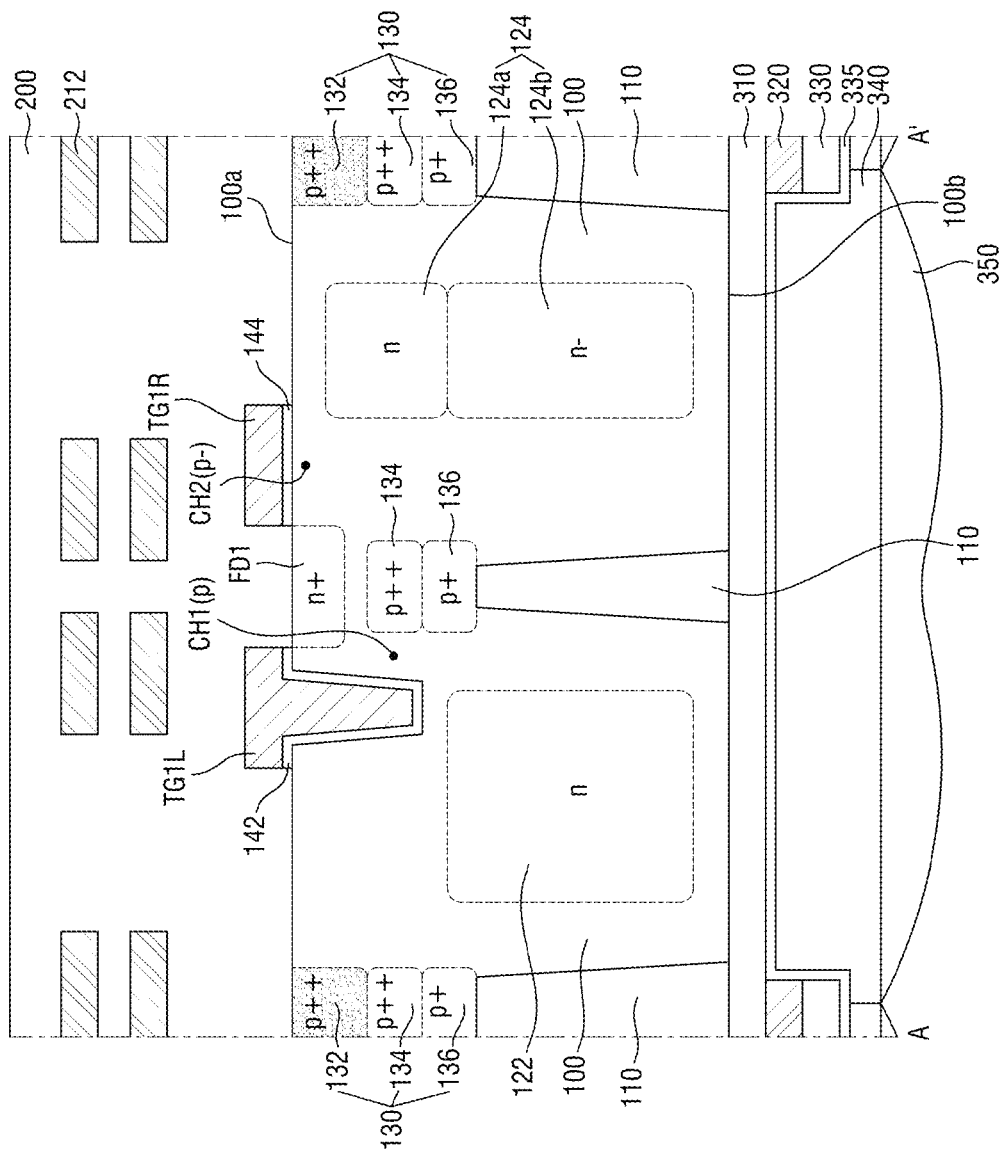
FIGS. 11 and 12 are cross-sectional views illustrating an image sensor according to some example embodiments.
Figure 12:
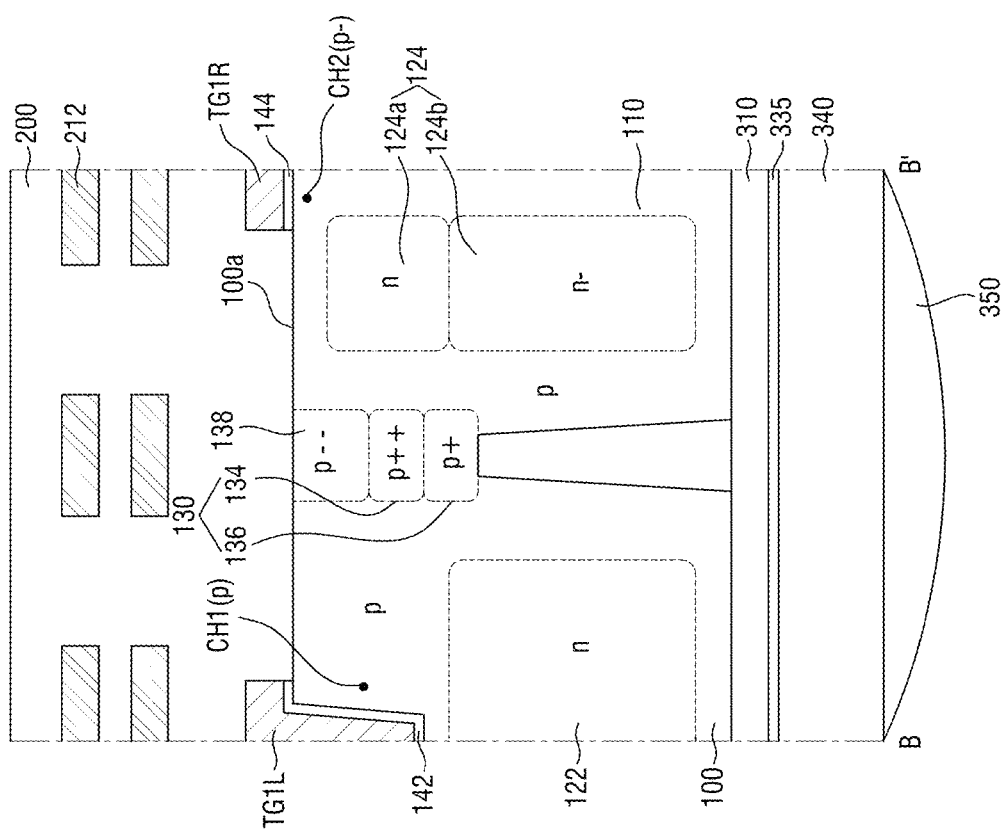

FIGS. 11 and 12 are cross-sectional views illustrating an image sensor according to some example embodiments. For simplicity of description, a description overlapping with the description with reference to FIGS. 1 to 10 will be briefly given or omitted.

Referring to FIGS. 11 and 12, the image sensor according to some example embodiments may further include an inter-wiring insulation layer 200, a plurality of wirings 212, a surface insulation layer 310, grid patterns 320 and 330, a color filter 340, and a micro lens 350.

The inter-wiring insulation layer 200 may be formed on the first surface 100a of the substrate 100. The inter-wiring insulation layer 200 may cover the first and second transfer gates TG1L and TG1R.

The plurality of wirings 212 may be formed in the inter-wiring insulation layer 200. The plurality of wirings 212 may interconnect various electronic devices (e.g., the first floating diffusion region FD1, the first transfer gate TG1L, the second transfer gate TG1R, the reset gate RG, the source follower gate SF, and the selection gate SEL) formed in a unit pixel. For example, the plurality of wirings 212 may include the wiring 210 of FIG. 3. In FIGS. 11 and 12, the number and arrangement of layers of the plurality of wirings 212 are merely an example for illustrative purposes.

The surface insulation layer 310 may be formed on the second surface 100b of the substrate 100. The surface insulation layer 310 may include, for example, at least one of silicon oxide, silicon nitride, silicon oxynitride, aluminum oxide, hafnium oxide, and combinations thereof, without being limited thereto.

In some example embodiments, the surface insulation layer 310 may be formed of multiple layers. For example, the surface insulation layer 310 may include an aluminum oxide layer, a hafnium oxide layer, a silicon oxide layer, a silicon nitride layer, and a hafnium oxide layer sequentially stacked on the second surface 100b of the substrate 100, but is not limited thereto.

The surface insulation layer 310 may function as a planarization layer such that the color filter 340 and the micro lens 350 to be described later are formed to have a uniform height. Alternatively or additionally, the surface insulation layer 310 may function as an anti-reflection layer to prevent/reduce the likelihood of light incident on the substrate 100 from being reflected, thereby improving the photo-receiving rate of the first and second photoelectric conversion units PD1L and PD1R.

The color filter 340 may be formed on the surface insulation layer 310. The color filter 340 may be arranged to correspond to each unit pixel. For example, a plurality of color filters 340 may be arranged two-dimensionally (e.g., in a matrix form, e.g. a rectangular matrix or hexagonal matrix).

The color filter 340 may have various colors according to a unit pixel. For example, the color filter 340 may be arranged in the form of a Bayer pattern including a red color filter, a green color filter, and a blue color filter. However, this is for example purposes only, and the color filter 340 may include a yellow filter, a magenta filter, and a cyan filter, and/or may further include a white filter.

In some example embodiments, the grid patterns 320 and 330 may be formed between the color filters 340. The grid patterns 320 and 330 may be formed on the surface insulation layer 310. In some example embodiments, the grid patterns 320 and 330 may be interposed between the color filters 340.

In some example embodiments, the grid patterns 320 and 330 may include a conductive pattern 320 and/or a low refractive index pattern 330. The conductive pattern 320 and the low refractive index pattern 330 may, for example, be sequentially stacked on the surface insulation layer 310.

The conductive pattern 320 may include a conductive material. For example, the conductive pattern 320 may include at least one of titanium (Ti), titanium nitride (TiN), tantalum (Ta), tantalum nitride (TaN), tungsten (W), aluminum (Al), copper (Cu), and combinations thereof, without being limited thereto. The conductive pattern 320 may prevent or reduce the likelihood of electric charges generated by ESD or the like from accumulating on the second surface 100b of the substrate 100, thereby effectively preventing/reducing the likelihood of an electrostatic discharge (ESD)-induced bruise.

The low refractive index pattern 330 may include a low refractive index material having a refractive index lower than that of silicon (Si). For example, the low refractive index pattern 330 may include at least one of silicon oxide, aluminum oxide, tantalum oxide, and combinations thereof, without being limited thereto. The low refractive index pattern 330 may refract and/or reflect light incident at an angle to improve light collection efficiency, thereby improving the quality of the image sensor.

In some example embodiments, a passivation layer 335 may be formed on the surface insulation layer 310 and the grid patterns 320 and 330. For example, the passivation layer 335 may extend conformally along the profiles of a top surface of the surface insulation layer 310 and side and top surfaces of the grid patterns 320 and 330.

The passivation layer 335 may include, for example, aluminum oxide, without being limited thereto. The passivation layer 335 may prevent or reduce the likelihood of the surface insulation layer 310 and the grid patterns 320 and 330 from being damaged.

The micro lens 350 may be formed on the color filter 340. The micro lens 350 may be arranged to correspond to each unit pixel. For example, a plurality of micro lenses 350 may be arranged two-dimensionally (e.g., in a matrix form such as a rectangular matrix or hexagonal matrix form).

The micro lens 350 may have a convex shape with a specific/predetermined curvature radius. Accordingly, the micro lens 350 may condense light incident on the first and second photoelectric conversion units PD1L and PD1R. The micro lens 350 may include, for example, a light-transmitting resin, without being limited thereto.

Figure 13:
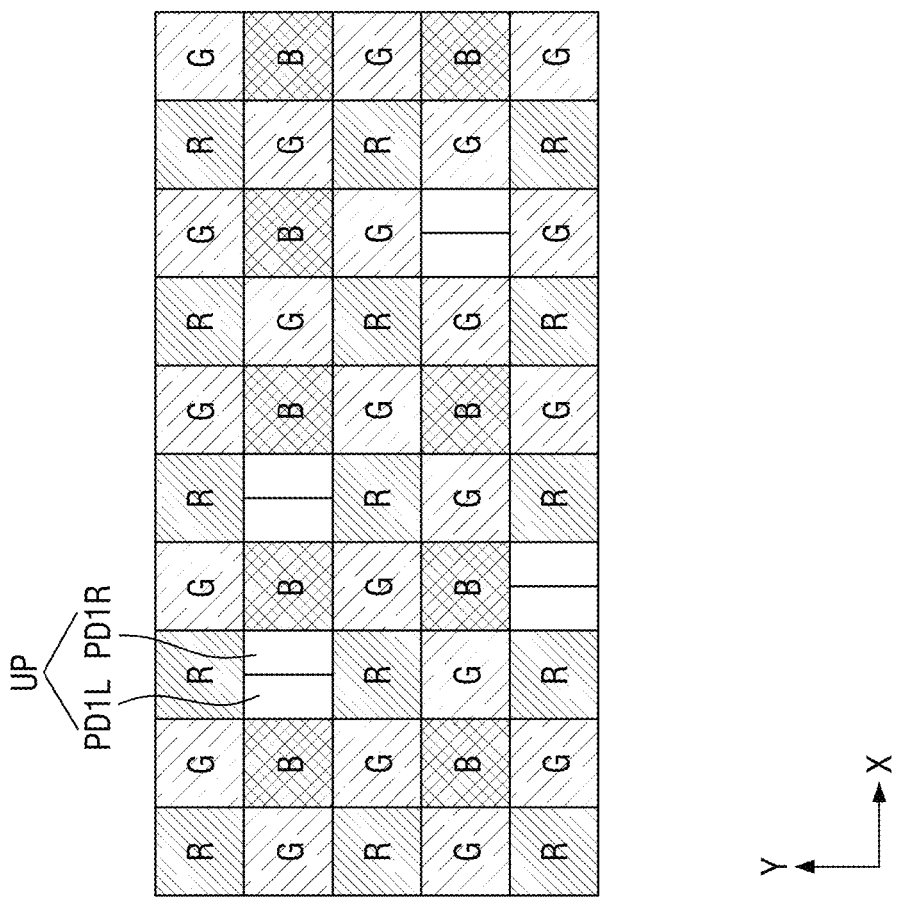
FIGS. 13 and 14 are various layout diagrams explaining the arrangement of unit pixels of an image sensor according to some example embodiments.
Figure 14:
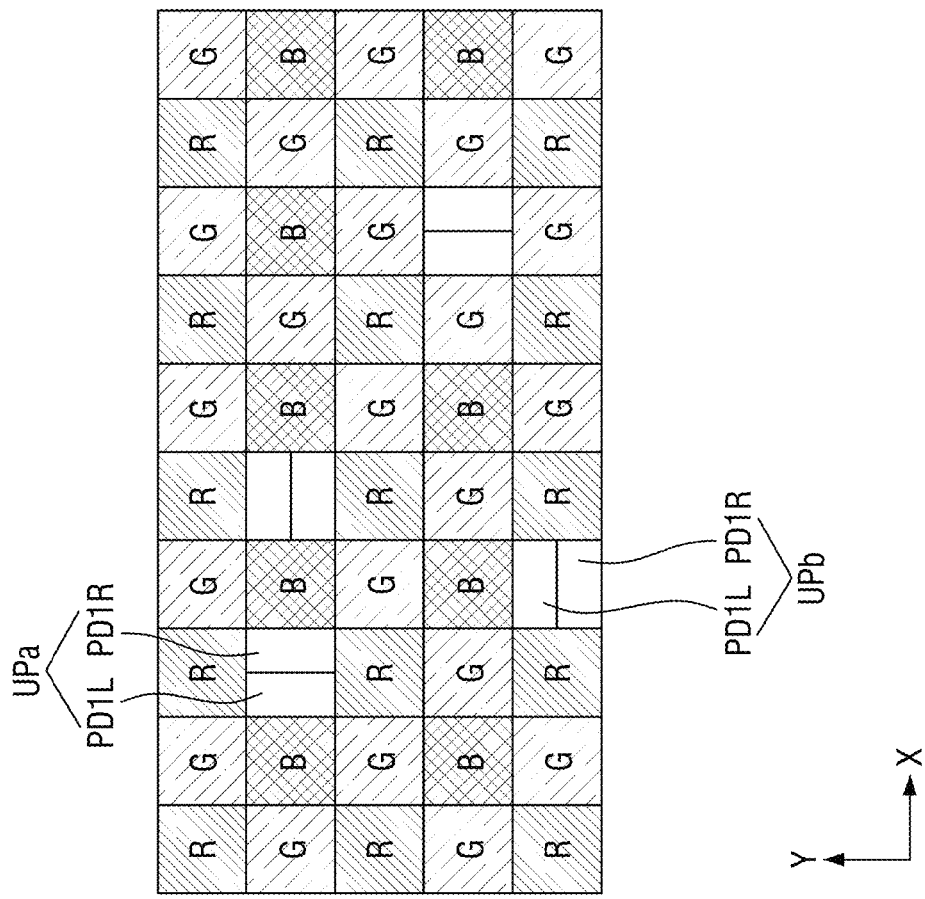

FIGS. 13 and 14 are various layout diagrams explaining the arrangement of unit pixels of an image sensor according to some example embodiments. For simplicity of description, a description overlapping with the description with reference to FIGS. 1 to 12 will be briefly given or omitted.

Referring to FIGS. 13 and 14, the image sensor according to some example embodiments includes a plurality of unit pixels arranged two-dimensionally (e.g., in a matrix form such as a rectangular matrix or hexagonal matrix form) on a plane including a first direction X and a second direction Y.

The plurality of unit pixels may, for example, be arranged in the form of a Bayer pattern. The Bayer pattern may include a first column in which red (R) and green (G) are repeatedly arranged and a second column in which green (G) and blue (B) are repeatedly arranged. However, this is only an example, and the plurality of pixels may be arranged in a pattern other than the Bayer pattern and/or may have colors other than red (R), green (G), and blue (B).

Referring to FIG. 13, the plurality of unit pixels may include a target unit pixel UP of the image sensor described with reference to FIGS. 1 to 12. For example, the target unit pixel UP may include the first photoelectric conversion unit PD1L and the second photoelectric conversion unit PD1R described with reference to FIGS. 1 to 12.

In some example embodiments, the target unit pixel UP may replace some of the unit pixels of green (G). However, this is only an example, and the target unit pixel UP may replace some of the unit pixels of red (R) or some of the unit pixels of blue (B).

In some example embodiments, the target unit pixel UP may perform an auto focus (AF) function. For example, because the target unit pixel UP may include the first and second photoelectric conversion units PD1L and PD1R, it may be possible to perform the auto focus function using a phase detection AF (PDAF).

Referring to FIG. 14, the plurality of unit pixels may include a first target unit pixel UPa and a second target unit pixel UPb of the image sensor described with reference to FIGS. 1 to 12. For example, the first and second target unit pixels UPa and UPb may each include the first and second photoelectric conversion units PD1L and PD1R described with reference to FIGS. 1 to 12.

In some example embodiments, the first target unit pixel UPa may include the first and second photoelectric conversion units PD1L and PD1R arranged along the first direction X and, the second target unit pixel UPb may include the first and second photoelectric conversion units PD1L and PD1R arranged along the second direction Y.

Figure 15:
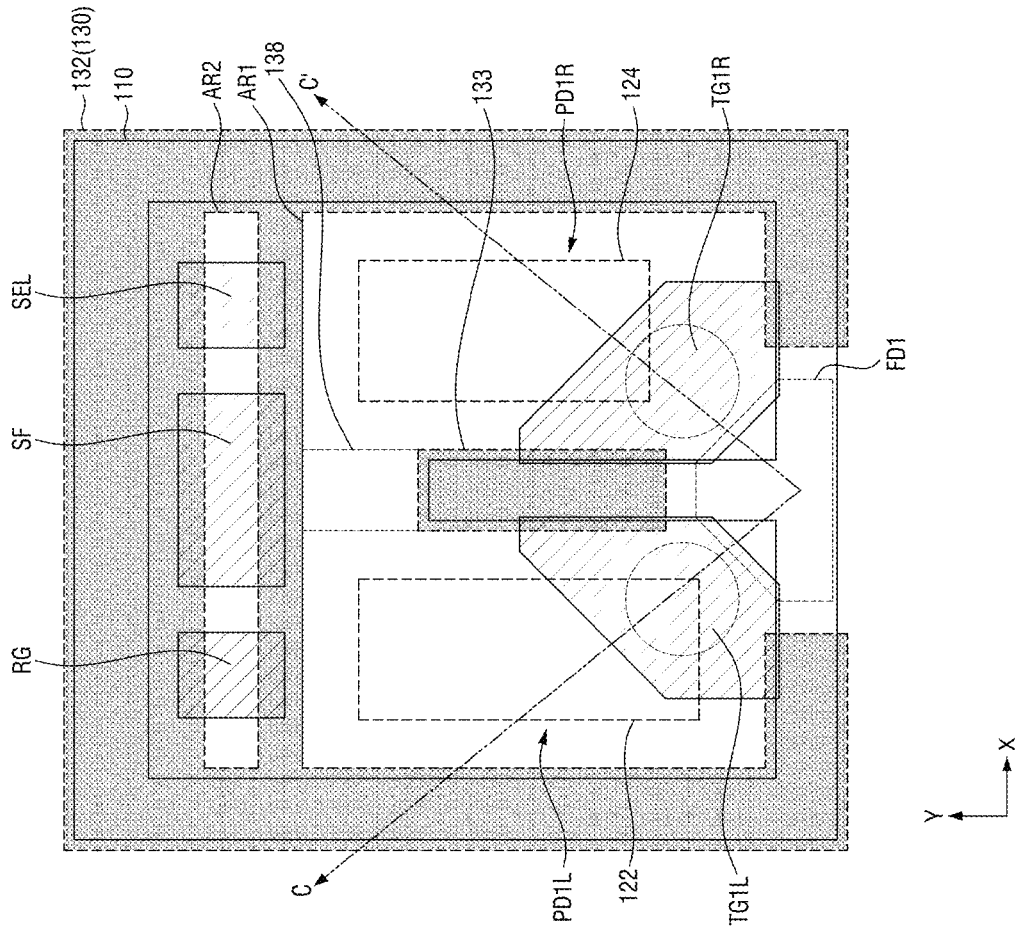
FIG. 15 is a layout diagram illustrating a unit pixel of an image sensor according to some example embodiments.
Figure 16:
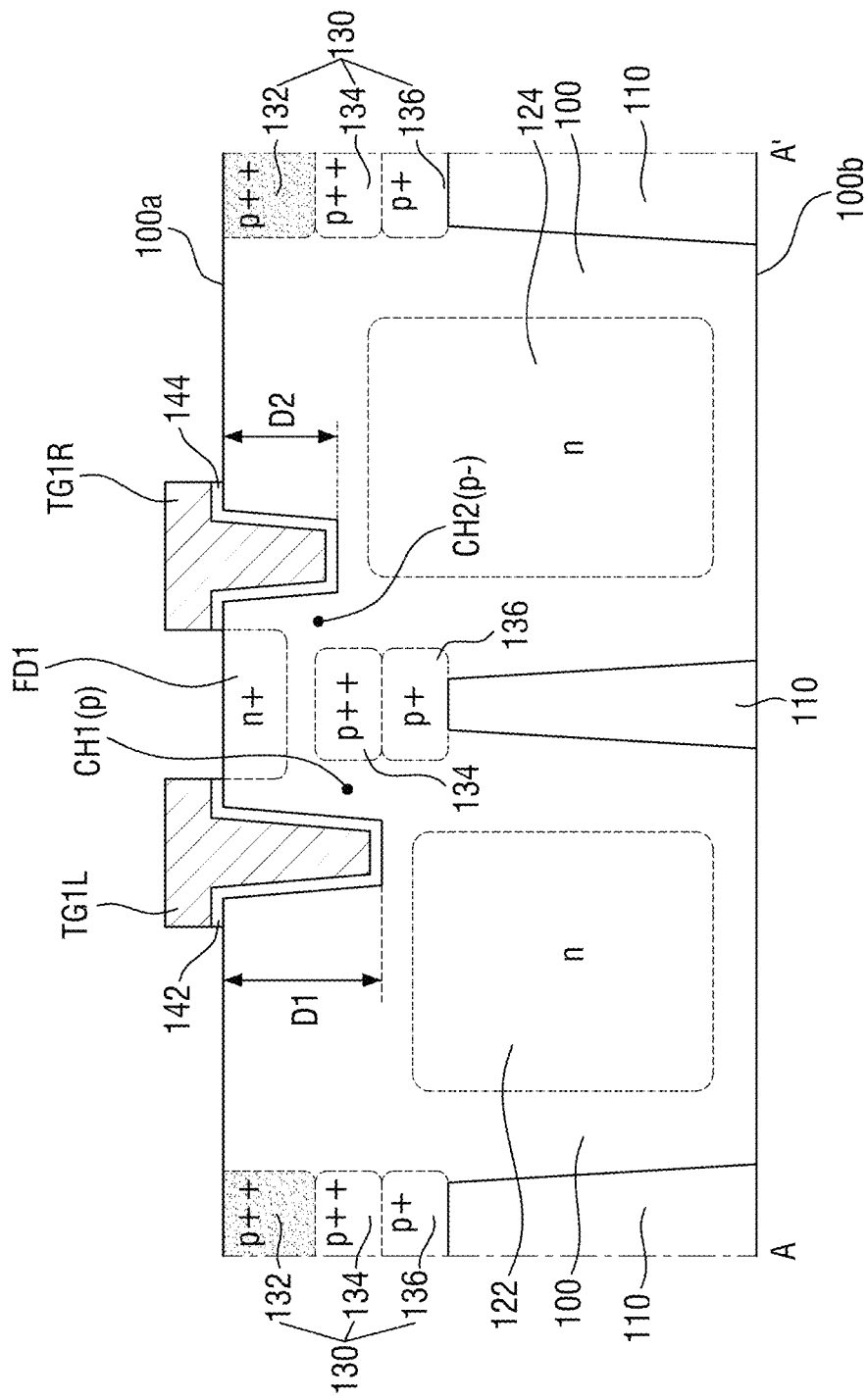
FIG. 16 is a cross-sectional view taken along line C-C' of FIG. 15.

FIG. 15 is a layout diagram illustrating a unit pixel of an image sensor according to some example embodiments. FIG. 16 is a cross-sectional view taken along line C-C' of FIG. 15. For simplicity of description, a description overlapping with the description with reference to FIGS. 1 to 14 will be briefly given or omitted.

Referring to FIGS. 15 and 16, in the image sensor according to some example embodiments, the second transfer gate TG1R is a vertical transfer gate.

At least a part of the second transfer gate TG1R may be buried in the substrate 100. For example, a trench extending from the first surface 100a of the substrate 100 may be formed in the substrate 100. The lower part of the second transfer gate TG1R may be formed to fill the trench. Accordingly, the bottom surface of the second transfer gate TG1R may be formed lower than the first surface 100a of the substrate 100, e.g. deeper than that of the first transfer gate TG1L. That is, both the first and second transfer gates TG1L and TG1R may be vertical transfer gates.

In some example embodiments, the bottom surface of the first transfer gate TG1L may differ in height from the bottom surface of the second transfer gate TG1R. For example, as shown in FIG. 16, the first depth D1 at which the first transfer gate TG1L is buried from the first surface 100a of the substrate 100 may be greater than the second depth D2 at which the second transfer gate TG1R is buried from the first surface 100a of the substrate 100.

In some example embodiments, the second photoelectric conversion region 124 may be formed below the second transfer gate TG1R. That is, the second photoelectric conversion region 124 may be formed in a deep region of the substrate 100. Accordingly, the second channel region CH2 may be formed from a deep region of the substrate 100. This may make it possible to secure a space of the first surface 100a adjacent to the second transfer gate TG1R, leading to provision of an image sensor with easy scaling.

In some example embodiments, the first photoelectric conversion region 122 may be spaced farther apart than the second photoelectric conversion region 124 from the first surface 100a of the substrate 100.

Figure 17:
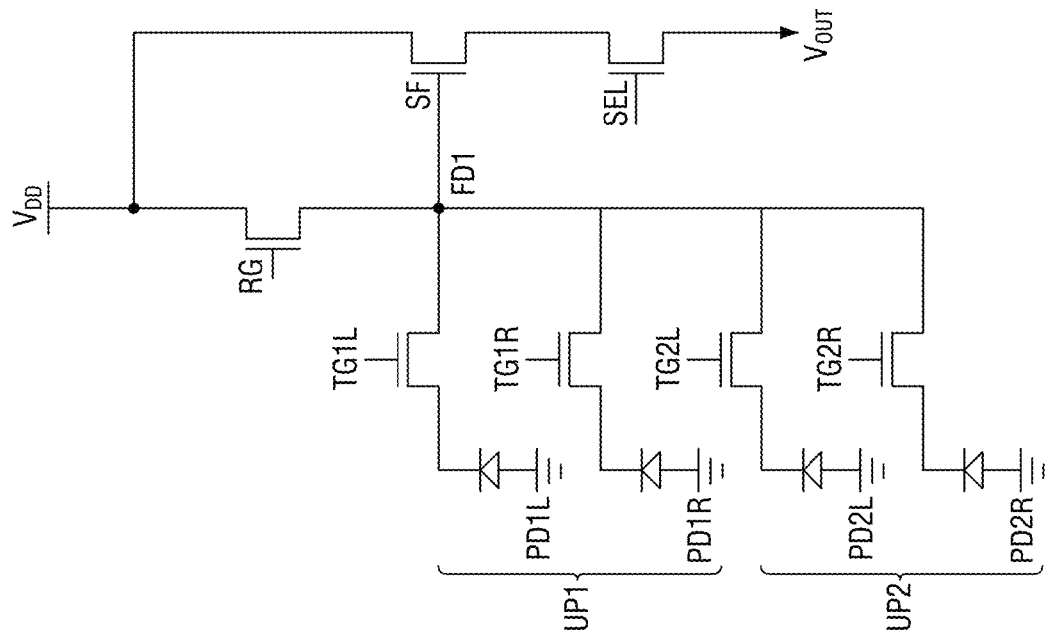
FIG. 17 is an example circuit diagram explaining an image sensor according to some example embodiments.
Figure 18:
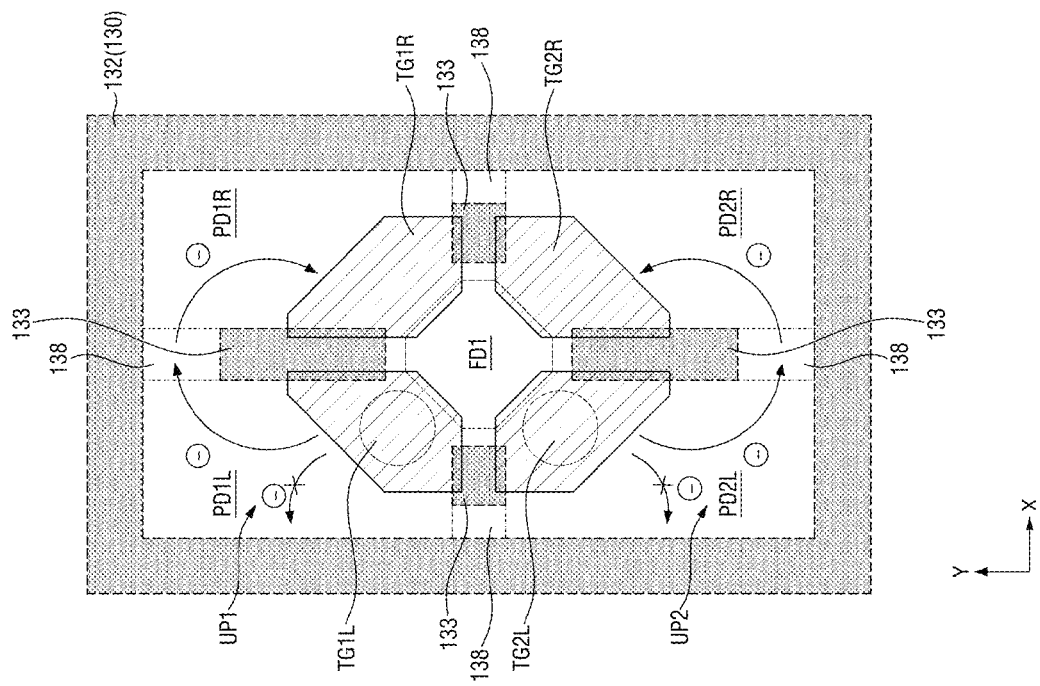
FIG. 18 is a layout diagram illustrating an image sensor according to some example embodiments.
Figure 19:
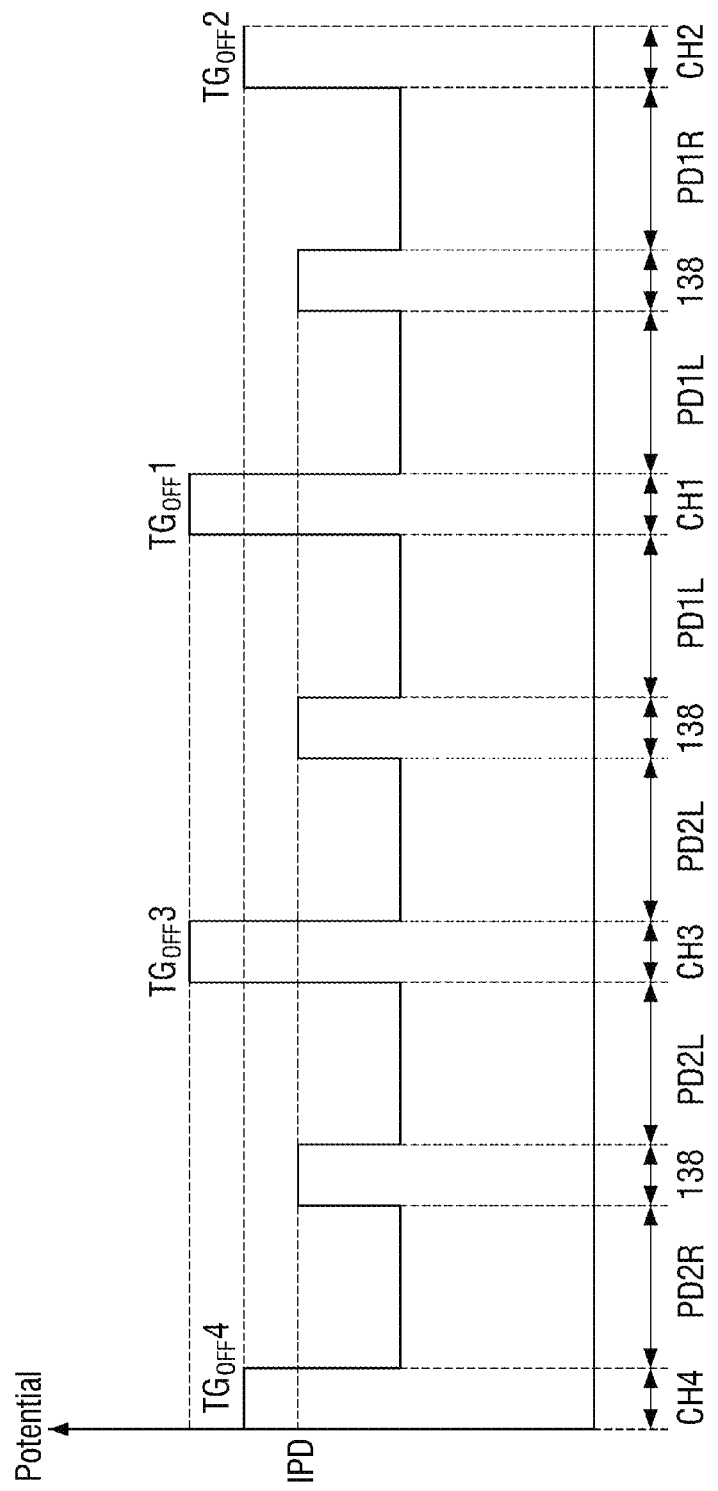
FIG. 19 is a graph explaining the potential of the image sensor of FIG. 18.

FIG. 17 is an example circuit diagram explaining an image sensor according to some example embodiments. FIG. 18 is a layout diagram illustrating an image sensor according to some example embodiments. FIG. 19 is a graph explaining the potential of the image sensor of FIG. 18. For simplicity of description, a description overlapping with the description with reference to FIGS. 1 to 16 will be briefly given or omitted.

Referring to FIGS. 17 to 19, the image sensor according to some example embodiments includes a first unit pixel UP1 and a second unit pixel UP2.

The first unit pixel UP1 may be or correspond to a unit pixel of the image sensor described with reference to FIGS. 1 to 16. Accordingly, a detailed description of the first unit pixel UP1 is omitted.

The second unit pixel UP2 may be adjacent to the first unit pixel UP1. For example, the first and second unit pixels UP1 and UP2 may be arranged along the second direction Y.

A third photoelectric conversion unit PD2L, a fourth photoelectric conversion unit PD2R, a third transfer gate TG2L, and a fourth transfer gate TG2R may be formed in the second unit pixel UP2. The first element isolation region 130 may define the second unit pixel UP2. For example, the first element isolation region 130 may be formed to surround the third and fourth photoelectric conversion units PD2L and PD2R.

The first to fourth photoelectric conversion units PD1L, PD1R, PD2L, and PD2R may be arranged two-dimensionally (e.g., in a matrix form such as a rectangular matrix or hexagonal matrix). For example, the first and third photoelectric conversion units PD1L and PD2L may be arranged along the second direction Y, and the second and fourth photoelectric conversion units PD1R and PD2R may be arranged along the second direction Y. The third and fourth photoelectric conversion units PD2L and PD2R may be arranged along the first direction X.

The third and fourth photoelectric conversion units PD2L and PD2R may generate electric charges in proportion to the amount of light incident from the outside. Because the third and fourth photoelectric conversion units PD2L and PD2R may be similar to the first and second photoelectric conversion units PD1L and PD1R, detailed descriptions thereof will be omitted for convenience of description.

The second element isolation region 133 may be interposed between the third and fourth photoelectric conversion units PD2L and PD2R, between the first and third photoelectric conversion units PD1L and PD2L, and between the second and fourth photoelectric conversion units PD1R and PD2R so as to separate the first to fourth photoelectric conversion units PD1L, PD1R, PD2L, and PD2R from one another.

The third element isolation region 138 may be interposed between the first and second element isolation regions 130 and 133 so as to separate the first to fourth photoelectric conversion units PD1L, PD1R, PD2L, and PD2R from one another.

The third transfer gate TG2L may be adjacent to the third photoelectric conversion unit PD2L. For example, the third transfer gate TG2L may be interposed between the third photoelectric conversion unit PD2L and the first floating diffusion region FD1. The third transfer gate TG2L may form a third channel region CH3 (see FIG. 19) in the substrate 100. If the third transfer gate TG2L is turned on, electric charges generated from the third photoelectric conversion unit PD2L may be transferred to the first floating diffusion region FD1 through the third channel region CH3.

In some example embodiments, the third transfer gate TG2L may be a vertical transfer gate. That is, at least a part of the third transfer gate TG2L may be buried in the substrate 100. In some example embodiments, the third photoelectric conversion unit PD2L may be formed below the third transfer gate TG2L. That is, the third photoelectric conversion unit PD2L may be formed in a deep region of the substrate 100.

The fourth transfer gate TG2R may be adjacent to the fourth photoelectric conversion unit PD2R. For example, the fourth transfer gate TG2R may be interposed between the fourth photoelectric conversion unit PD2R and the first floating diffusion region FD1. The fourth transfer gate TG2R may form a fourth channel region CH4 (see FIG. 19) in the substrate 100. If the fourth transfer gate TG2R is turned on, electric charges generated from the fourth photoelectric conversion unit PD2R may be transferred to the first floating diffusion region FD1 through the fourth channel region CH4.

In some example embodiments, the first to fourth transfer gates TG1L, TG1R, TG2L, and TG2R may share the first floating diffusion region FD1. For example, the first to fourth transfer gates TG1L, TG1R, TG2L, and TG2R may be arranged to surround the first floating diffusion region FD1.

In some example embodiments, the bottom surface of the third transfer gate TG2L may differ in height from the bottom surface of the fourth transfer gate TG2R. For example, the bottom surface of the third transfer gate TG2L may be formed to be lower in height than the bottom surface of the fourth transfer gate TG2R. In some example embodiments, the third transfer gate TG2L may be a vertical transfer gate, and the fourth transfer gate TG2R may be a planar transfer gate.

In some example embodiments, the third off potential $TG_{OFF}3$ of the third channel region CH3 in the case where the third transfer gate TG2L is in an off state may differ from the fourth off potential $TG_{OFF}4$ of the fourth channel region CH4 in the case where the fourth transfer gate TG2R is in an off state. For example, as shown in FIG. 19, the third off potential $TG_{OFF}3$ may be higher than the fourth off potential $TG_{OFF}4$.

Although it is shown that the third off potential $TG_{OFF}3$ is equal to the first off potential $TG_{OFF}1$ and the fourth off potential $TG_{OFF}4$ is equal to the second off potential $TG_{OFF}2$, this is only an example. For example, the third off potential $TG_{OFF}3$ may differ from the first off potential $TG_{OFF}1$, and the fourth off potential $TG_{OFF}4$ may differ from the second off potential $TG_{OFF}2$.

As the third off potential $TG_{OFF}3$ increases, the full well capacity (FWC), as the total amount of electric charges that the third photoelectric conversion unit PD2L can hold, may be improved. Accordingly, an image sensor with an improved FWC may be provided.

In some example embodiments, the potential IPD of the third element isolation region 138 may be lower than the third off potential $TG_{OFF}3$ and the fourth off potential $TG_{OFF}4$. For example, the fourth off potential $TG_{OFF}4$ may be lower than the third off potential $TG_{OFF}3$, and the potential IPD of the third element isolation region 138 may be lower than the fourth off potential $TG_{OFF}4$.

That is, similarly to the description made with reference to FIGS. 8 to 9B, as shown in FIG. 18, a blooming path may be formed in order for the electric charges of the third photoelectric conversion unit PD2L to cross the third element isolation region 138 and gradually move toward the fourth transfer gate TG2R. This may mitigate the blooming phenomenon in which electric charges of the third photoelectric conversion unit PD2L cross the first element isolation region 130 and move to adjacent unit pixels.

Figure 20:
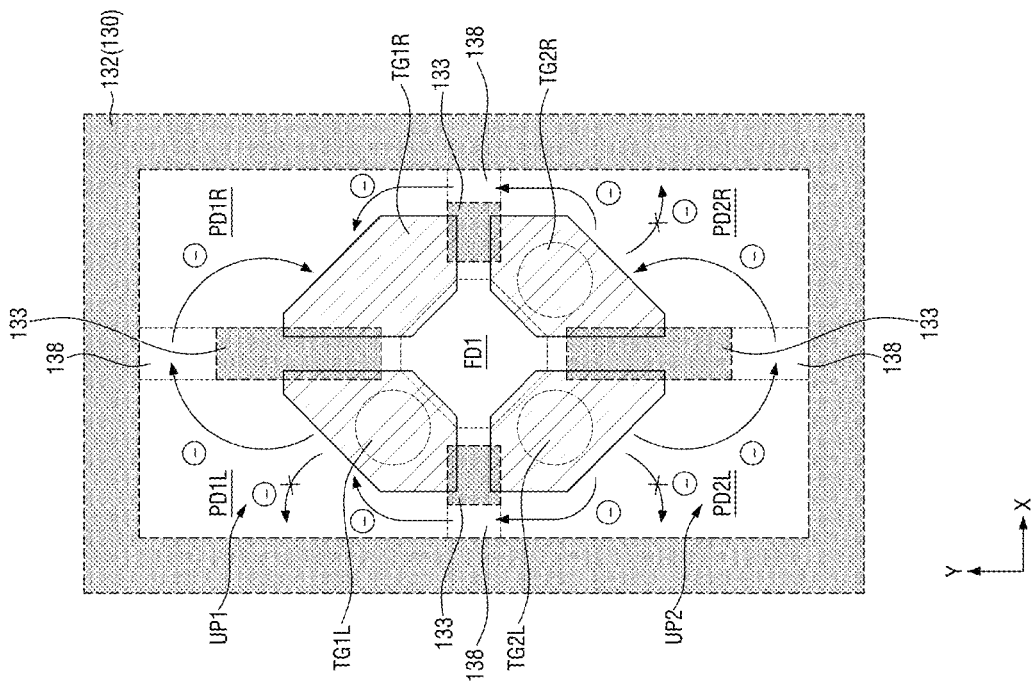
FIG. 20 is a layout diagram illustrating an image sensor according to some example embodiments.
Figure 21:
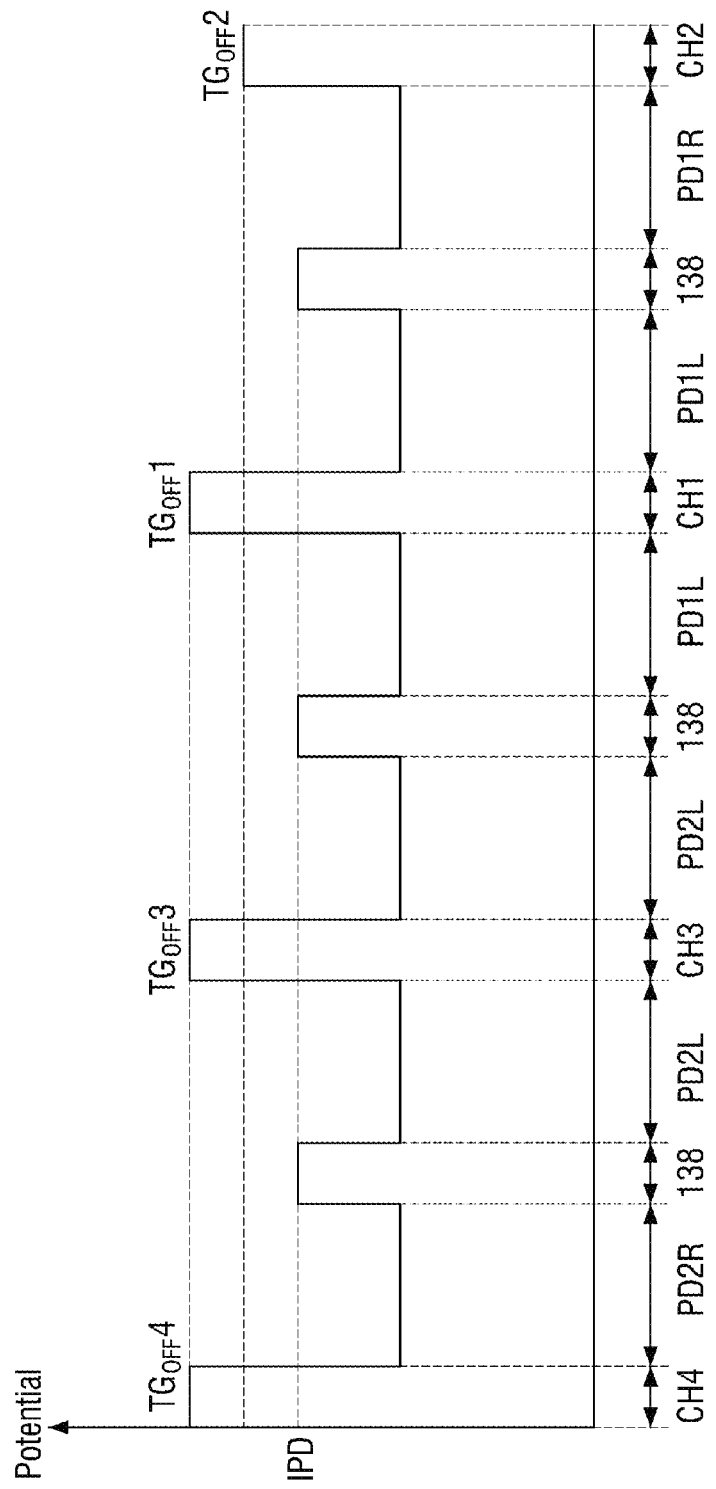
FIGS. 21 and 22 are various graphs explaining the potential of the image sensor of FIG. 20.
Figure 22:
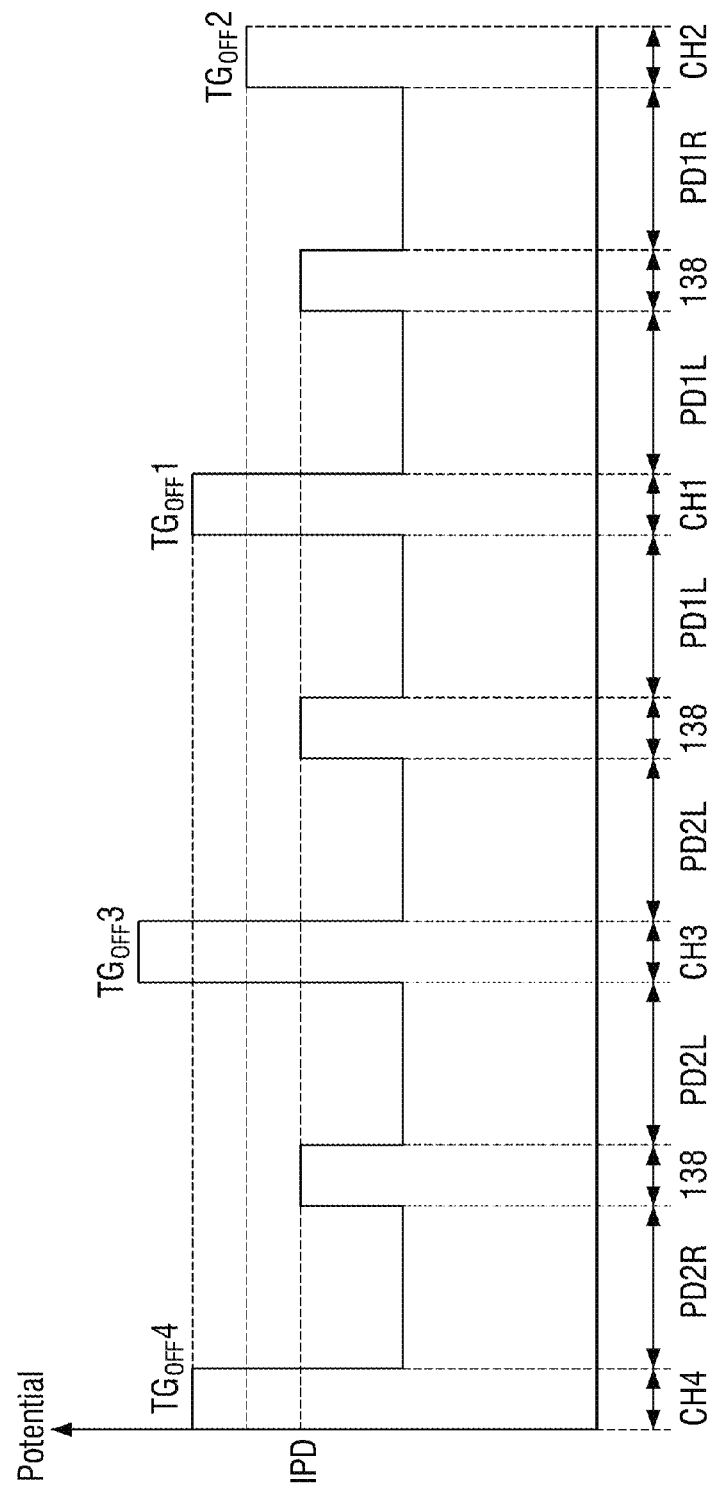

FIG. 20 is a layout diagram illustrating an image sensor according to some example embodiments. FIGS. 21 and 22 are various graphs explaining the potential of the image sensor of FIG. 20. For simplicity of description, a description overlapping with the description with reference to FIGS. 1 to 19 will be briefly given or omitted.

Referring to FIGS. 20 to 22, in the image sensor according to some example embodiments, the fourth transfer gate TG2R is a vertical transfer gate.

At least a part of the fourth transfer gate TG2R may be buried in the substrate 100. That is, all of the first transfer gate TG1L, the third transfer gate TG2L, the fourth transfer gate TG2R may be vertical transfer gates.

In some example embodiments, the fourth off potential $TG_{OFF}4$ of the fourth channel region CH4 in the case where the fourth transfer gate TG2R is in an off state may differ from the second off potential $TG_{OFF}2$ of the second channel region CH2 in the case where the second transfer gate TG1R is in an off state. For example, as shown in FIG. 21, the fourth off potential $TG_{OFF}4$ may be higher than the second off potential $TG_{OFF}2$.

Although it is shown that the fourth off potential $TG_{OFF}4$ is equal to the first off potential $TG_{OFF}1$ and the third off potential $TG_{OFF}3$, this is only an example. For example, the fourth off potential $TG_{OFF}4$ may differ from the first off potential $TG_{OFF}1$ and/or the third off potential $TG_{OFF}3$.

As the fourth off potential $TG_{OFF}4$ increases, the full well capacity (FWC), as the total amount of electric charges that the fourth photoelectric conversion unit PD2R can hold, may be improved. Accordingly, an image sensor with an improved FWC may be provided.

In some example embodiments, the potential IPD of the third element isolation region 138 may be lower than the fourth off potential $TG_{OFF}4$ and the second off potential $TG_{OFF}2$. The second off potential $TG_{OFF}2$ may be lower than the fourth off potential $TG_{OFF}4$, and the potential IPD of the third element isolation region 138 may be lower than the second off potential $TG_{OFF}2$.

That is, similarly to the description made with reference to FIGS. 8 to 9B, a blooming path in which electric charges of the fourth photoelectric conversion unit PD2R cross the third element isolation region 138 and gradually move toward the second transfer gate TG1R may be formed as shown in FIG. 20. This may mitigate the blooming phenomenon in which electric charges of the fourth photoelectric conversion region PD2R cross the first element isolation region 130 and move to adjacent unit pixels.

In some example embodiments, the third off potential $TG_{OFF}3$ of the third channel region CH3 may differ from the first off potential $TG_{OFF}1$ of the first channel region CH1 and the fourth off potential $TG_{OFF}4$ of the fourth channel region CH4. For example, as shown in FIG. 22, the third off potential $TG_{OFF}3$ may be higher than the first off potential $TG_{OFF}1$ and the fourth off potential $TG_{OFF}4$.

In this case, as the third off potential $TG_{OFF}3$ further increases, the full well capacity (FWC), as the total amount of electric charges that the third photoelectric conversion unit PD2L can hold, may be improved. Accordingly, an image sensor with a further improved FWC may be provided.

Further, in this case, it may be possible to facilitate formation of the blooming path in which electric charges of the third photoelectric conversion region PD2L cross the third isolation region 138 and gradually move toward the first and fourth transfer gates TG1L and TG2R. This may make it possible to further mitigate the blooming phenomenon in which electric charges of the third photoelectric conversion unit PD2L cross the first element isolation region 130 and move toward adjacent unit pixels.

Figure 23:
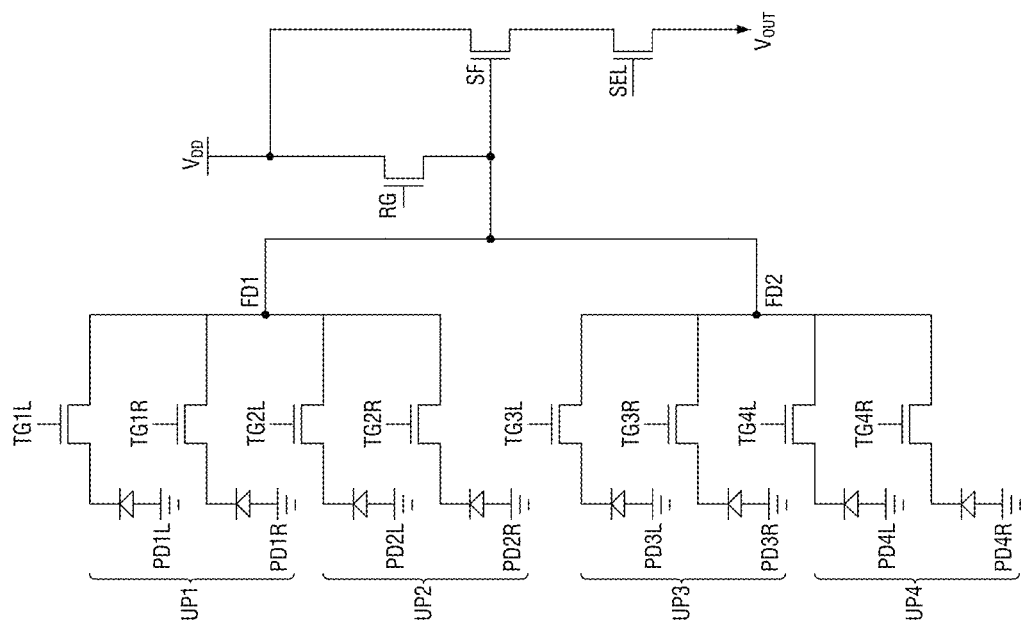
FIG. 23 is an example circuit diagram explaining an image sensor according to some example embodiments.
Figure 24:
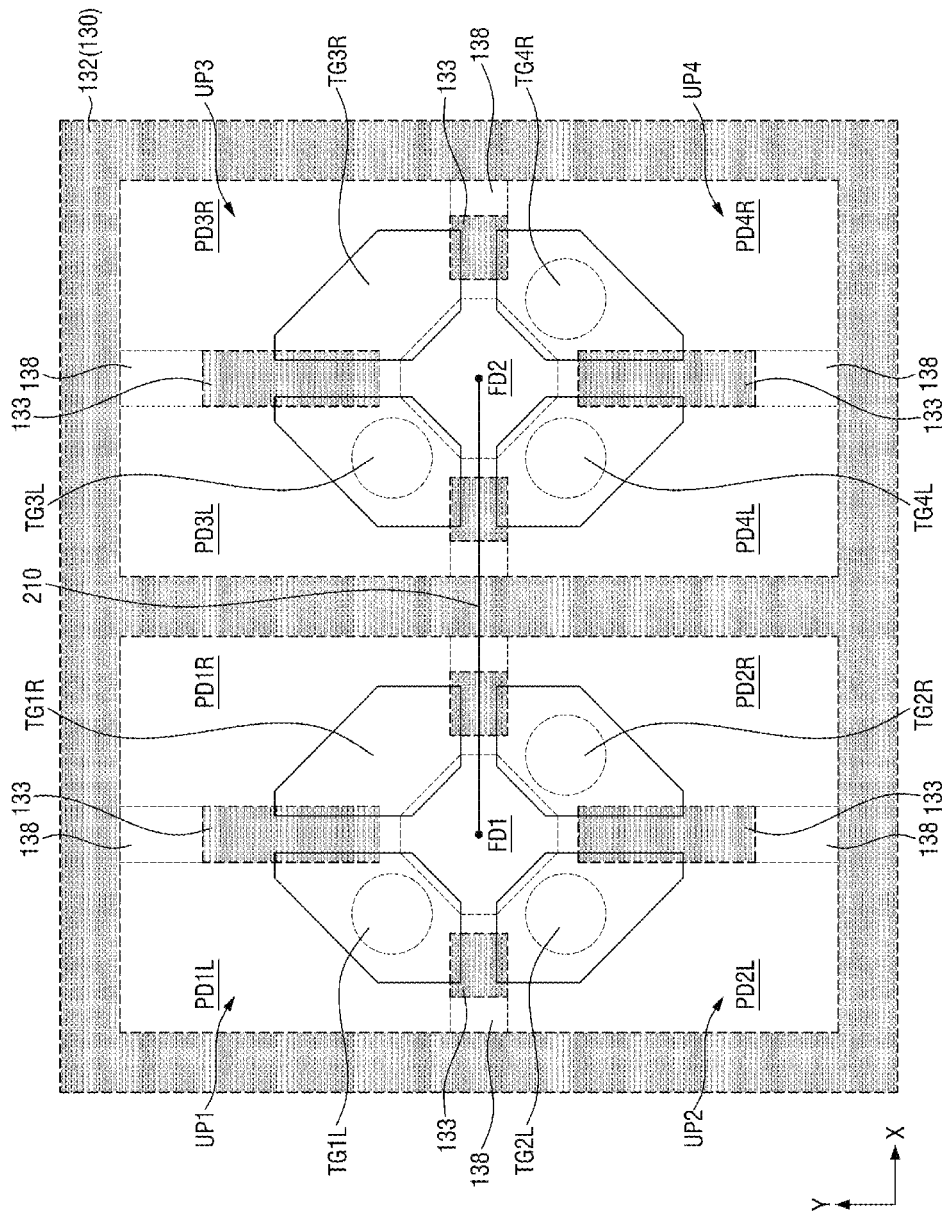
FIG. 24 is a layout diagram illustrating an image sensor according to some example embodiments.
Figure 25:
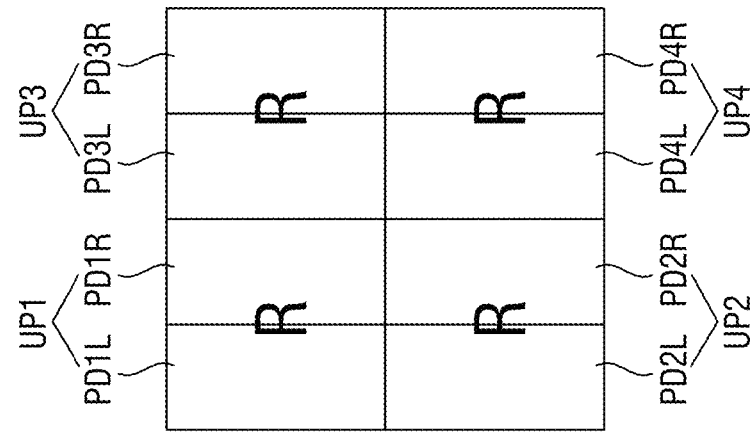
FIGS. 25 and 26 are various layout diagrams explaining a color arrangement of the image sensor of FIG. 24.
Figure 26:
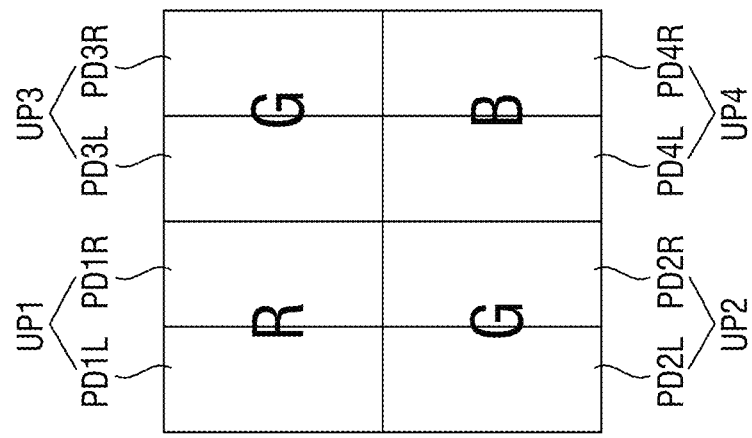

FIG. 23 is an example circuit diagram explaining an image sensor according to some example embodiments. FIG. 24 is a layout diagram illustrating an image sensor according to some example embodiments. FIGS. 25 and 26 are various layout diagrams explaining a color arrangement of the image sensor of FIG. 24. For simplicity of description, a description overlapping with the description with reference to FIGS. 1 to 22 will be briefly given or omitted.

Referring to FIGS. 23 and 24, the image sensor according to some example embodiments may further include a third unit pixel UP3 and a fourth unit pixel UP4.

The third and fourth unit pixels UP3 and UP4 may be adjacent to the first and second unit pixels UP1 and UP2. The first to fourth unit pixels UP1, UP2, UP3, and UP4 may be arranged two-dimensionally (e.g., in a matrix form). For example, the first and third unit pixels UP1 and UP3 may be arranged along the first direction X, and the second and fourth unit pixels UP2 and UP4 may be arranged along the first direction X. The third and fourth unit pixels UP3 and UP4 may be arranged along the second direction Y.

A fifth photoelectric conversion unit PD3L, a sixth photoelectric conversion unit PD3R, a fifth transfer gate TG3L, and a sixth transfer gate TG3R may be formed in the third unit pixel UP3. Because the third unit pixel UP3 may be similar to the first unit pixel UP1, a detailed description thereof is omitted for convenience of description.

A seventh photoelectric conversion unit PD4L, an eighth photoelectric conversion unit PD4R, a seventh transfer gate TG4L, and an eighth transfer gate TG4R may be formed in the fourth unit pixel UP4. Because the fourth unit pixel UP4 may be similar to the second unit pixel UP2, a detailed description thereof is omitted for convenience of description.

In some example embodiments, the fifth to eighth transfer gates TG3L, TG3R, TG4L, and TG4R may share the second floating diffusion region FD2. For example, the fifth to eighth transfer gates TG3L, TG3R, TG4L, and TG4R may be arranged to surround the second floating diffusion region FD2.

In some example embodiments, the first and second floating diffusion regions FD1 and FD2 may be electrically connected to each other. For example, a wiring 210 for connecting the first and second floating diffusion regions FD1 and FD2 may be formed as shown in FIG. 24.

Referring to FIGS. 23 and 24, in the image sensor according to some example embodiments, the first to fourth unit pixels UP1, UP2, UP3, and UP4 may be arranged in the form of a tetra pattern.

The tetra pattern may include an arrangement in which four unit pixels have the same color. Although it is shown in FIG. 25 that the first to fourth unit pixels UP1, UP2, UP3, and UP4 arranged to be all red (R), the first to fourth unit pixels UP1, UP2, UP3, and UP4 may be all green (G), blue (B), or a color other than red (R), green (G), and blue (B).

Referring to FIGS. 23 and 25, in the image sensor according to some example embodiments, the first to fourth unit pixels UP1, UP2, UP3, and UP4 may be arranged in the form of a Bayer pattern.

The Bayer pattern may include a first column in which red (R) and green (G) are repeatedly arranged and a second column in which green (G) and blue (B) are repeatedly arranged. However, this is only an example, and the first to fourth unit pixels UP1, UP2, UP3, and UP4 may have colors other than red (R), green (G), and blue (B).

Any of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While example embodiments have been particularly shown and described with reference to example embodiments thereof, it will be understood by those of ordinary skill in the art that various changes in form and details may be made therein without departing from the spirit and scope of example embodiments as defined by the following claims. It is therefore desired that example embodiments be considered in all respects as illustrative and not restrictive, reference being made to the appended claims rather than the foregoing description to indicate the scope of inventive concepts.

What is claimed is:

1. An image sensor comprising:
a substrate including a first surface and a second surface opposite to the first surface;
a first element isolation region in the substrate, the first element isolation region defining a unit pixel;
a first photoelectric conversion region in the unit pixel;
a second photoelectric conversion region in the unit pixel, the second photoelectric conversion region spaced apart from the first photoelectric conversion region;
a floating diffusion region in the substrate, the floating diffusion region adjacent to the first surface of the substrate;
a first transfer gate on the first surface of the substrate, the first transfer gate between the first photoelectric conversion region and the floating diffusion region; and
a second transfer gate on the first surface of the substrate, the second transfer gate between the second photoelectric conversion region and the floating diffusion region, wherein
at least a part of the first transfer gate is buried in the substrate, and
a bottom surface of the first transfer gate is at a different level from a bottom surface of the second transfer gate,
the first transfer gate is configured to form a first channel region in the substrate,
the second transfer gate is configured to form a second channel region in the substrate,
a first off potential of the first channel region is different from a second off potential of the second channel region, the first off potential occurring in response to the first transfer gate being in an off state, the second off potential occurring in response to the second transfer gate being in an off state,
the first channel region has a first conductivity type with a first impurity concentration, and
the second channel region has the first conductivity type with the second impurity concentration different from the first impurity concentration.

2. The image sensor of claim 1, wherein the bottom surface of the first transfer gate is at a lower level from the second surface of the substrate than the bottom surface of the second transfer gate from the second surface of the substrate, and
the first off potential is greater than the second off potential.

3. The image sensor of claim 1, wherein the bottom surface of the second transfer gate extends along the first surface of the substrate.

4. The image sensor of claim 1, wherein at least a part of the second transfer gate is buried in the substrate, and
a first depth at which the first transfer gate is buried is different from a second depth at which the second transfer gate is buried.

5. The image sensor of claim 1, further comprising:
a second element isolation region in the substrate, the second element isolation region between the first photoelectric conversion region and the second photoelectric conversion region; and
a third element isolation region in the substrate, the third element isolation region between the first element isolation region and the second element isolation region, wherein the first to third element isolation regions have a first conductivity type, and
the first and second photoelectric conversion regions have a second conductivity type different from the first conductivity type.

6. The image sensor of claim 5, wherein
the first channel region is in the substrate between the first photoelectric conversion region and the floating diffusion region,
the second channel region is in the substrate between the second photoelectric conversion region and the floating diffusion region, and
a third impurity concentration of the third element isolation region is less than the first impurity concentration and the second impurity concentration.

7. The image sensor of claim 1, further comprising an element isolation pattern in the substrate, the element isolation pattern defining the unit pixel,
wherein the element isolation pattern extends from the second surface of the substrate to the first element isolation region.

8. An image sensor comprising:
a first element isolation region in a substrate, the first element isolation region defining a unit pixel and having a first conductivity type;
a first photoelectric conversion region in the unit pixel, the first photoelectric conversion region having a second conductivity type different from the first conductivity type;
a second photoelectric conversion region in the unit pixel, the second photoelectric conversion region having the second conductivity type;
a second element isolation region having the first conductivity type, the second element isolation region in the substrate, the second element isolation region between the first photoelectric conversion region and the second photoelectric conversion region;
a third element isolation region having the first conductivity type, the third element isolation region in the substrate, the third element isolation region between the first element isolation region and the second element isolation region;
a floating diffusion region in the substrate, the floating diffusion region having the second conductivity type;
a first channel region in the substrate between the first photoelectric conversion region and the floating diffusion region, the first channel region having the first conductivity type with a first impurity concentration;
a second channel region in the substrate between the second photoelectric conversion region and the floating diffusion region, the second channel region having the first conductivity type with a second impurity concentration lower than the first impurity concentration;
a first transfer gate on the first channel region, at least a part of the first transfer gate buried in the substrate; and
a second transfer gate on the second channel region,
wherein a third impurity concentration of the third element isolation region is less than the first impurity concentration and less than the second impurity concentration.

9. The image sensor of claim 8, wherein the third impurity concentration is less than a fourth impurity concentration of the first element isolation region and less than a fifth impurity concentration of the second element isolation region.

10. The image sensor of claim 9, wherein each of the first impurity concentration is less than the fourth impurity concentration and the second impurity concentration is less than the fourth impurity concentration.

11. The image sensor of claim 9, wherein the first impurity concentration is greater than the fourth impurity concentration.

12. The image sensor of claim 8, wherein a bottom surface of the first transfer gate is lower in height than a bottom surface of the second transfer gate.

13. The image sensor of claim 8, wherein the substrate includes a first surface and a second surface opposite to the first surface, the second surface being a surface to which light is incident, and
the first transfer gate and the second transfer gate are on the first surface of the substrate.

14. The image sensor of claim 13, further comprising an element isolation pattern defining the unit pixel in the substrate,
wherein the element isolation pattern extends from the second surface of the substrate to the first element isolation region.

15. The image sensor of claim 13, further comprising:
an inter-wiring insulation layer on the first surface of the substrate, the inter-wiring insulation layer covering the first transfer gate and the second transfer gate;
a plurality of wirings in the inter-wiring insulation layer; and
a micro lens on the second surface of the substrate.

16. An image sensor comprising:
a first element isolation region in a substrate, the first element isolation region defining a unit pixel and having a first conductivity type;
a first photoelectric conversion circuitry in the unit pixel;
a second photoelectric conversion circuitry in the unit pixel;
a second element isolation region in the substrate between the first photoelectric conversion circuitry and the second photoelectric conversion circuitry, the second element isolation region having the first conductivity type;
a third element isolation region in the substrate between the first element isolation region and the second element isolation region, the third element isolation region having the first conductivity type with an impurity concentration lower than those of both the first and the second element isolation regions;
a first transfer gate adjacent to the first photoelectric conversion circuitry, the first transfer gate forming a first channel region in the substrate; and
a second transfer gate adjacent to the second photoelectric conversion circuitry, the second transfer gate forming a second channel region in the substrate,
wherein in response to the first transfer gate being in an off state, a potential of the first channel region is at a first off potential,
in response to the second transfer gate being in an off state, a potential of the second channel region is at a second off potential different from the first off potential, and
a potential of the third element isolation region is less than the first off potential and less than the second off potential.

17. The image sensor of claim 16, wherein at least a part of the first transfer gate is buried in the substrate, and
the first off potential is greater than the second off potential.

18. The image sensor of claim 17, wherein the second off potential is less than a potential of the first element isolation region.

* * * * *